(12) United States Patent
Yokogawa et al.

(10) Patent No.: US 6,617,653 B1
(45) Date of Patent: Sep. 9, 2003

(54) MISFET

(75) Inventors: Toshiya Yokogawa, Nara (JP); Makoto Kitabatake, Nara (JP); Osamu Kusumoto, Nara (JP); Kunimasa Takahashi, Osaka (JP); Takeshi Uenoyama, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/048,344

(22) PCT Filed: Nov. 20, 2000

(86) PCT No.: PCT/JP00/08156

§ 371 (c)(1),
(2), (4) Date: Jan. 30, 2002

(87) PCT Pub. No.: WO01/93339

PCT Pub. Date: Dec. 6, 2001

(30) Foreign Application Priority Data

May 31, 2000 (JP) .......................................... 2000-101598

(51) Int. Cl.[7] ........................... H01L 29/94; H01L 29/00
(52) U.S. Cl. ...................... 257/379; 257/531; 257/532; 257/77; 257/339
(58) Field of Search ................................ 257/385, 394, 257/395, 344, 408, 68, 69, 71, 296, 300, 336, 316, 339, 77, 379, 531, 532; 438/105, 931, 957

(56) References Cited

U.S. PATENT DOCUMENTS

| | | |
|---|---|---|
| 3,626,328 A | 12/1971 | Esaki et al. |
| 5,212,104 A | 5/1993 | Klose |
| 5,488,237 A | 1/1996 | Kuwata |
| 5,977,564 A * | 11/1999 | Kobayashi et al. ........... 257/18 |
| 6,057,558 A | 5/2000 | Yamamoto et al. |

FOREIGN PATENT DOCUMENTS

| | | |
|---|---|---|
| EP | 0555886 A2 | 8/1993 |
| EP | 1231640 A1 | 8/2002 |
| JP | 53-95571 | 8/1978 |
| JP | 2-71563 * | 3/1990 |
| JP | 02071563 | 3/1990 |
| JP | 05013446 A | 1/1993 |
| JP | 7-263708 | 10/1995 |
| JP | 11-251592 | 9/1999 |

OTHER PUBLICATIONS

Applied Physics Letters, vol. 72, No. 18, May, 1998, pp. 2286–2288.

International Search Report, PCT/JP00/08156, Feb. 13, 2001.

Kenji Noda, et al., "A 0.1–$\mu$m Delta–Doped MOSFET Fabricated With Post–Low–Energy Implanting Selectivity Epitaxy", IEEE Transactions on Electron Devices, vol. 45, No. 4, pp. 809–813, Apr. 1998.

(List continued on next page.)

Primary Examiner—Nathan J. Flynn
Assistant Examiner—Tan Tran
(74) Attorney, Agent, or Firm—Harness, Dickey & Pierce, PLC

(57) ABSTRACT

P-type active region 12; n-type source/drain regions 13$a$ and 13$b$; gate insulating film 14 made of a thermal oxide film; gate electrode 15; source/drain electrodes 16$a$ and 16$b$, are provided over a p-type SiC substrate 11. In the active region 12, p-type heavily doped layers 12$a$, which are thin enough to create a quantum effect, and thick undoped layers 12$b$ are alternately stacked. When carriers flow, scattering of impurity ions in the active region is reduced, and the channel mobility increases. In the OFF state, a depletion layer expands throughout the active region, and the breakdown voltage increases. As a result of reduction in charges trapped in the gate insulating film or near the interface between the gate insulating film and the active region, the channel mobility further increases.

28 Claims, 22 Drawing Sheets

OTHER PUBLICATIONS

K. Nakagawa, et al., "Atomic Layer Doped Field–Effect Transistor Using Si Molecular Beam Epitaxy", Applied Physics Letters, vol. 54, No. 19, pp. 1869–1871, May 8, 1989.

A. Ben Jazia, et al., "Stark Effect Studied in δ–Doped GaAs Structures", Semiconductor Science and Technology, vol. 12, No. 11, pp. 1388–1395, 1997.

K. Takahashi, et al., "Vertical Hot–Wall Type CVD For SiC Growth", Materials Science Forum, vols. 338–342, pp. 141–144, 2000.

European Search Report EP 00976351 dated Nov. 26, 2002, J. Gélébart.

* cited by examiner

MISFET

TECHNICAL FIELD

The present invention relates to a MISFET formed by utilizing a compound semiconductor layer. More particularly, the present invention relates to a MISFET that has a high breakdown voltage and is suitable for use at a large current.

BACKGROUND ART

Silicon carbide (SiC) is a semiconductor that has a wider bandgap than that of silicon (Si). Accordingly, SiC has a higher breakdown voltage and a higher melting point compared to Si. In view of these beneficial properties, SiC is a semiconductor material that is expected to be applied to next-generation power electronic devices, RF devices, high-temperature-operating devices and so on. It is also known that SiC can take various crystal structures including cubic ones such as 3C-SiC and hexagonal ones like 6H-SiC and 4H-SiC.

FIG. 12 is a cross-sectional view schematically showing the structure of a known NMOS (Metal Oxide Semiconductor)-FET (Field Effect Transistor) that uses SiC. FIG. 12 shows p-type doped channel SiC layer 102 that has been grown epitaxially on the surface of a p-type SiC substrate 101 doped with aluminum (a p-type impurity) at a concentration of $1 \times 10^{18}$ atoms·cm$^{-3}$; n-type source/drain regions 103a and 103b doped with nitrogen (an n-type impurity) at a concentration of $1 \times 10^{18}$ cm$^{-3}$ and formed in the doped channel SiC layer 102; gate insulating film 104 of SiO$_2$ formed on the doped channel SiC layer 102; gate electrode 105 made of an Ni alloy film and formed on the gate insulating film 104; source/drain electrodes 106a and 106b made of an Ni alloy film in ohmic contact with the respective source/drain regions 103a and 103b; and backside electrode 107 made of an Ni alloy film in ohmic contact with the back surface of the SiC substrate 101.

In this structure, if a constant voltage is applied between the source/drain electrodes 106a and 106b, and another voltage (a gate voltage) is applied to the gate electrode 105, a current flowing between the source/drain regions 103a and 103b is modulated in accordance with the gate voltage so that a switching operation is performed. In particular, a MOSFET formed on a SiC substrate has higher breakdown voltage characteristic than those of a MOSFET formed on a Si substrate, and is highly regarded as a power electronic device that can supply a large current as well as expected to be implemented as an RF device.

PROBLEMS TO BE SOLVED

A power electronic device with a high-speed operation formed on a SiC substrate has been required to further improve in channel mobility and breakdown voltage with respect to its applications. This improvement has been continuously required by all semiconductor industries using compound semiconductor layers such as GaAs, GaN, SiGe, and SiGeC layers as well as a SiC layer for an active region.

In addition, the known MOSFET has problems peculiar to semiconductor devices including compound semiconductor layers. Specifically, a lot of interface states and charges exist at the interface between the gate insulating film 104 and the doped channel SiC layer 102 in the known NMOSFET, thus causing harmful effects on its characteristics as an ideal MOS device. A gate insulating film in a MOSFET formed on a Si substrate is generally made of a SiO$_2$ film (a thermal oxide film), which is formed by thermally oxidizing the Si substrate. For this thermal oxide film, since dangling bonds of Si atoms exist in the surface of the Si substrate, a certain amount of interface states are inevitably generated. It is known that the density of the interface states is about $10^{10}$.

On the other hand, it is known that even when the surface of a SiC layer is thermally oxidized to form a SiO$_2$ film (a thermal oxide film), about $10^{12}$ interface states or fixed charges still exist at the interface between the SiC layer and the SiO$_2$ film thereon. Hence, the amount of interface states or fixed charges is greater than that in the Si substrate by about two orders of magnitude. It has been considered that this is because carbon, for example, which should have been removed during the thermal oxidation, remains as an impurity in the surface of the SiC layer and because an impurity for carriers (an n-type or a p-type impurity) in the SiC layer to be thermally oxidized is incorporated into the resultant thermal oxide film.

FIG. 13 illustrates an energy band in the gate electrode 105, gate insulating film 104, and doped channel SiC layer 102 when carriers flow, i.e., in an inversion state, in a known NMOSFET. As shown in FIG. 13, in the known NMOSFET, the threshold voltage thereof, for example, varies according to high-density interface states and positive charges trapped as fixed charges. Simultaneously, carriers (electrons) flowing through the channel are affected by interaction with the charges, resulting in decrease in channel mobility and deterioration in characteristics such as transconductance and high frequency response. Likewise, in a PMOSFET, negative charges are trapped in a gate insulating film, resulting in deterioration in characteristics of the device.

In addition to the device using the SiC substrate, devices using a substrate made of a compound semiconductor such as GaAs or GaN also have the same problems. Presumably, one of the reasons is that a compound semiconductor is composed of two or more elements. At the present time, even if an oxide film formed on the surface of a compound semiconductor substrate is used as a gate insulating film, it is difficult for the device to obtain characteristics suitable for practical use. Not only in the MOSFET but as long as an oxynitride film, a nitride film, or other metal oxide film (such as a tantalum oxide film) is used as a gate insulating film, the same problems might occur due to either positive or negative charge trapping.

DISCLOSURE OF INVENTION

It is therefore an object of the present invention to ensure a high-speed operation and a high breakdown voltage in a semiconductor device with a MISFET structure provided on a compound semiconductor substrate. It is another object of this invention to provide a semiconductor device exhibiting excellent electronic characteristics by using means for preventing harmful effects on characteristics of a transistor resulting from interface states or fixed charges created between a gate insulating film and a channel region.

An inventive first MISFET includes: a compound semiconductor layer formed on a substrate; two heavily doped layers, which are defined and spaced apart from each other in the compound semiconductor layer and contain an impurity of a first conductivity type; an active region, which is sandwiched between the two heavily doped layers and contains an impurity of a second conductivity type; a gate insulating film formed on the active region; and a gate electrode formed on the gate insulating film. The active region is formed by alternately stacking at least one first semiconductor layer functioning as a region where carriers flow and at least one second semiconductor layer containing an impurity for carriers at a high concentration and smaller in film thickness than the first semiconductor layer such that carriers spread out therein under a quantum effect. A region in the active region that is in contact with the gate insulating film is occupied by the first semiconductor layer.

According to this structure, the impurity concentration is low in the first semiconductor layer. Thus, scattering of impurity ions is reduced in the first semiconductor layer, and an especially high channel mobility is achieved. On the other hand, since the impurity concentration is low in the first semiconductor layer, the number of charges of the second conductivity type, trapped in the gate insulating film or near the interface between the gate insulating film and the active region, decreases and flowing of carriers is less prevented by the charges. When carriers spread out under a quantum effect, charges of the first conductivity type are trapped in an impurity contained in the second semiconductor layer. Thus, flowing of carriers can be compensated for by the charges of the second conductivity type trapped in the gate insulating film or near the interface between the gate insulating film and the active region. Accordingly, it is possible to further increase the channel mobility.

In addition, regardless of high average impurity concentration in the active region, a depletion layer expands throughout the active region and no carrier exists in the active region in the OFF state. Thus, the breakdown voltage is fixed by the first semiconductor layer with a low impurity concentration, and a high breakdown voltage is obtained throughout the active region.

The substrate and the compound semiconductor layer may be formed as a unit, and a trench may be formed by digging in the compound semiconductor layer. In such a case, the gate insulating film and the gate electrode are formed so as to surround the bottom and the side faces of the trench. One of the two heavily doped layers is defined in the uppermost part of the compound semiconductor layer and the other is defined in the lowest part of the compound semiconductor layer. Then, it is possible to obtain a vertical power MISFET that occupies a small area and has the advantages of low current consumption, a low voltage drive and a high gain by utilizing the function of the active region.

A second inventive MISFET includes: a compound semiconductor layer formed on a substrate; a gate insulating film formed on the compound semiconductor layer; two heavily doped layers, which are defined and spaced apart from each other in the compound semiconductor layer and contain an impurity of a first conductivity type; a first active region, which is sandwiched between the two heavily doped layers in the compound semiconductor layer, contains an impurity of a first conductivity type, and functions as a region where carriers flow; and a gate electrode formed on the gate insulating film. The first active region is formed by stacking at least one first semiconductor layer and at least one second semiconductor layer containing an impurity for carriers at a concentration higher than in the first semiconductor layer and smaller in film thickness than the first semiconductor layer such that carriers spread out therein under a quantum effect.

According to this structure, a quantum state resulting from a quantum effect occurs in the second semiconductor layer of the first active region so that the wave function of carriers, which exist locally in the second semiconductor layer, expands to a certain degree. As a result, carriers are distributed not only in the second semiconductor layer but also in the first semiconductor layer. In this state, when potential is enhanced in the active region and carriers expand from the second semiconductor layer to the first semiconductor layer under the quantum effect, carriers are continuously supplied to the first and second semiconductor layers. Since the carriers flow in the first semiconductor layer with a low impurity concentration, scattering of impurity ions are reduced, thus obtaining a high channel mobility. On the other hand, in the OFF state, a depletion layer expands throughout the first active region, and no carrier exists in the first active region. Thus, the breakdown voltage is fixed by the first semiconductor layer having a low impurity concentration, and a high breakdown voltage is obtained throughout the first active region. Accordingly, in a MISFET functioning as an ACCUFET in which a large current flows between first and second heavily doped layers utilizing a first active region of a first conductivity type, a high channel mobility and a high breakdown voltage can be simultaneously achieved.

A region in the first active region that is in contact with the gate insulating film may be occupied by the first semiconductor layer. Then, the impurity concentration is low in the gate insulating film formed by thermally oxidizing the first semiconductor layer, and the number of charges of the second conductivity type trapped in the gate insulating film decreases. Thus, flowing of carriers is less prevented by the charges.

The MISFET may include a second active region, which is formed at least in either a region between the first active region and the gate insulating film or a region facing the gate insulating film with the first active region sandwiched therebetween and contains an impurity of a second conductivity type. Then, the breakdown voltage below the channel can be further increased.

The second active region may be further provided by stacking a plurality of first semiconductor layers and at least one second semiconductor layer containing an impurity for carriers at a concentration higher than in the first semiconductor layers and smaller in film thickness than each of the first semiconductor layers such that carriers spread out therein under a quantum effect. Then, a depletion layer expands throughout the second active region in the OFF state. As a result, the breakdown voltage further increases.

The substrate and the compound semiconductor layer may be formed as a unit. A trench may be formed by digging in the compound semiconductor layer. The gate insulating film and the gate electrode may be formed so as to surround the bottom and the side faces of the trench. One of the two heavily doped layers may be defined in the uppermost part of the compound semiconductor layer and the other may be defined in the lowest part of the compound semiconductor layer. Then, it is possible to obtain a vertical power MISFET that occupies a small area and has the advantages of low current consumption, a low voltage drive and a high gain by utilizing the functions of the first and second active regions.

In the case where the second semiconductor layer is a SiC layer, the thickness of the second semiconductor layer is preferably at least one monolayer and less than 20 nm.

In the case where the first semiconductor layer is a SiC layer, the thickness of the first semiconductor layer is preferably not less than about 10 nm to not more than about 100 nm.

BEST MODE FOR CARRYING OUT THE INVENTION

Embodiment 1

First, a first embodiment of the present invention which is an example of an NMOSFET with a multilayer structure composed of δ-doped layers having a steep concentration profile enough to create a quantum effect and undoped layers (lightly doped layers) will be herein described.

Figure 1:
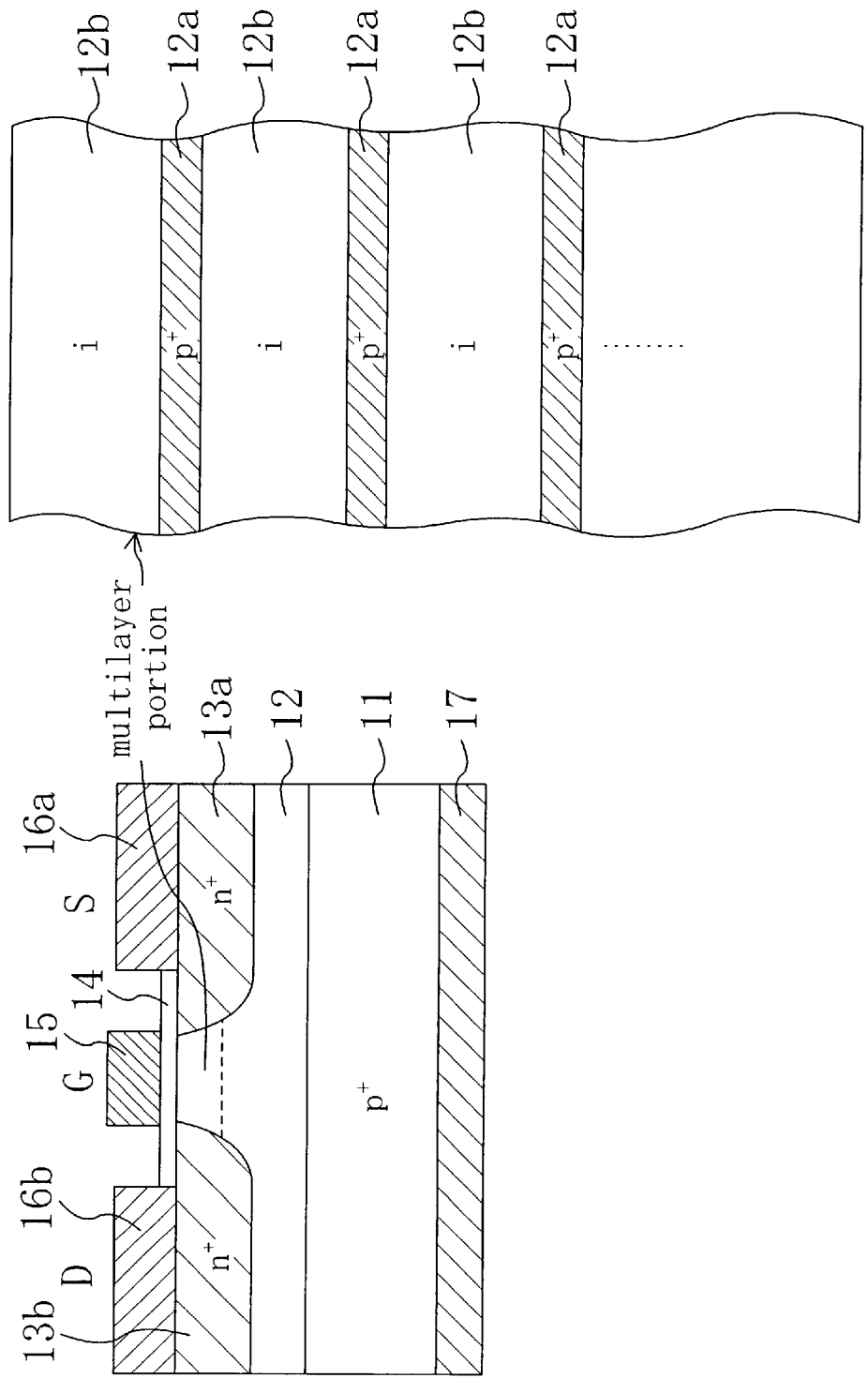
FIG. 1 shows cross-sectional views schematically illustrating the structure of an NMOSFET according to a first embodiment of the present invention.

FIG. 1 shows cross-sectional views schematically illustrating the structure of an NMOSFET according to the first embodiment. FIG. 1 shows p-type active region 12 that is doped with aluminum and formed on a p-type SiC substrate 11 doped with aluminum (a p-type impurity) at a concentration of $1 \times 10^{18}$ atoms·cm$^{-3}$; n-type source/drain regions 13a and 13b formed in part of the active region 12 by implanting nitrogen at a concentration of $1 \times 10^{18}$ cm$^{-3}$; gate insulating film 14 of SiO$_2$ formed on the active region 12; gate electrode 15 made of an Ni alloy film and formed on the gate insulating film 14; source/drain electrodes 16a and 16b made of an Ni alloy film in ohmic contact with the respective source/drain regions 13a and 13b; and backside electrode 17 made of an Ni alloy film in ohmic contact with the back surface of the SiC substrate 11. The SiC substrate 11 is doped with the p-type impurity at high concentration so as to easily make an ohmic contact with the backside electrode 17. However, the overall SiC substrate 11 is not necessarily doped with this p-type impurity but rather only the lower end of the SiC substrate 11 may be doped with the p-type impurity. Alternatively, the SiC substrate 11 may be doped with a p-type impurity at low concentration. In addition, the backside electrode 17 is not necessarily formed. If no backside electrode is provided, the overall SiC substrate may be an undoped layer.

As shown in the right part of FIG. 1 under magnification, a feature of this embodiment is that the lower part of the active region 12 is an undoped layer with a thickness of about 1500 nm; and the upper part thereof is a multilayer portion formed by alternately stacking five p-type doped layers 12a each including aluminum at a high concentration (e.g., $1 \times 10^{18}$ atoms·cm$^{-3}$) and having a thickness of about 10 nm and five undoped layers 12b each made of undoped 6H-SiC single crystals and having a thickness of about 50 nm. The p-type doped layers 12a in the multilayer portion are formed sufficiently thin to allow spreading of carriers to the undoped layers 12b under a quantum effect. Accordingly, special effects can be achieved as follows.

Figure 2A:
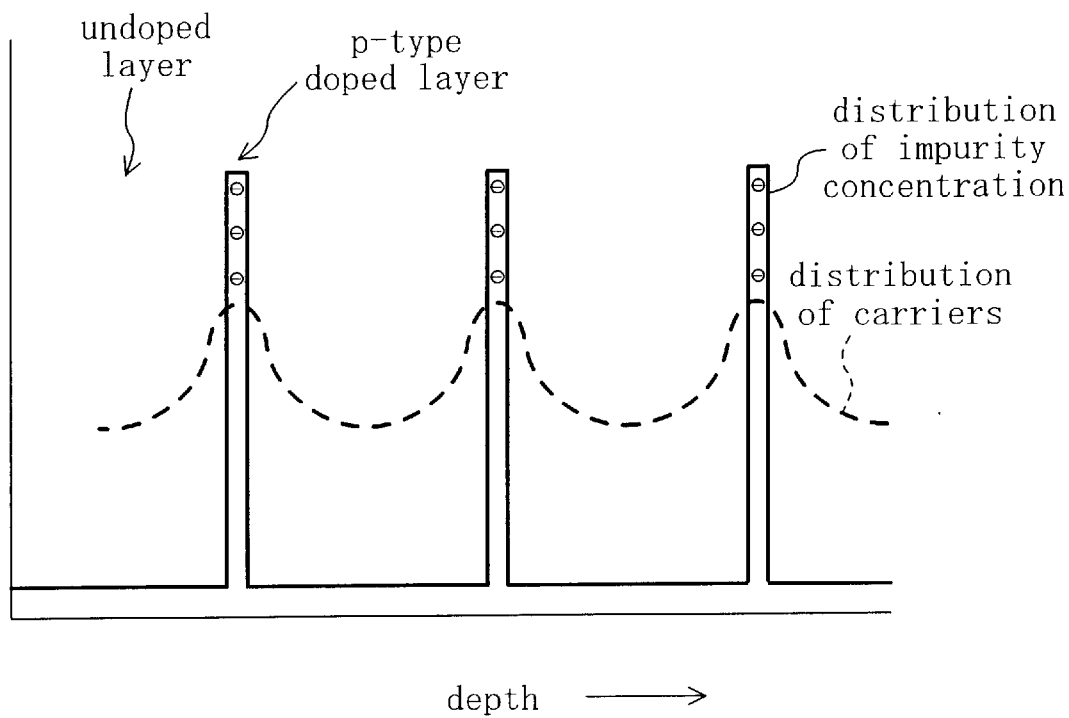
FIG. 2(a) schematically shows the relationship between the concentration profile of aluminum and the distribution of carriers along the depth of an active region having the basic structure of the first embodiment.
Figure 2B:
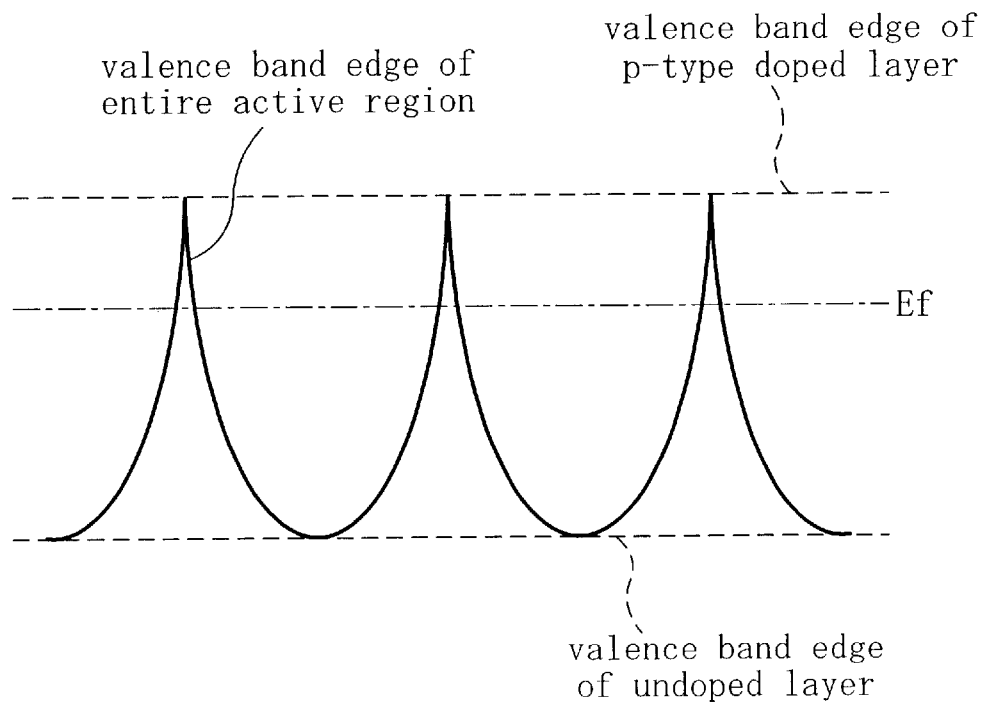
FIG. 2(b) is a partial band diagram showing the configuration of a valence band edge along the depth of the active region.

FIG. 2(a) schematically shows the relationship between the concentration profile of aluminum as a p-type impurity and the distribution of carriers along the depth of the multilayer portion in the active region 12 having the basic structure of this embodiment. FIG. 2(b) is a partial band diagram showing the configuration of a valence band edge along the depth of the multilayer portion in the active region 12. FIGS. 2(a) and 2(b) relate to a model created for the case where the aluminum concentration in the undoped layers 12b (the lightly doped layers) is $5\times10^{15}$ atoms·cm$^{-3}$ and the aluminum concentration in the p-type doped layers 12a (the heavily doped layers) is $1\times10^{18}$ atoms·cm$^{-3}$.

In this case, as shown in FIG. 2(a), the impurity concentration profile in the p-type doped layers 12a is given substantially by the shape of δ functions with respect to primers of the undoped layers 12b. That is, the p-type doped layers 12a can be taken as so-called δ-doped layers. In addition, as shown in FIG. 2(b), the valence band edge in the entire active region 12 has a configuration connecting the valence band edge in the p-type doped layers 12a to the valence band edge in the undoped layers 12b, respectively indicated by the broken lines. Although the impurity concentration in the p-type doped layers 12a is preferably increased to a value at which the valence band edge therein is higher than the Fermi level $E_f$, the impurity concentration in the p-type doped layers 12a does not necessarily have to be increased to such a high value.

As shown in FIG. 2(a), since the thickness of the p-type doped layers 12a is as thin as about 10 nm in the multilayer portion of the active region 12 of this embodiment, a quantum state resulting from a quantum effect occurs in the p-type doped layers 12a so that the wave function of holes, which exist locally in the p-type doped layers 12a as quantum wells, expands to a certain degree. That is to say, holes are distributed not only in the p-type doped layers 12a but also in the undoped layers 12b, as indicated by the broken curve in the drawing. As a result, negative charges are trapped in the impurity contained in the p-type doped layers 12a.

On the other hand, consider the case where a voltage is applied between the source/drain regions 13a and 13b while substantially no voltage is applied to the gate electrode 15, i.e., in the OFF state. In this case, a depletion layer expands between the drain region 13a and the multilayer portion in the active region 12. In the NMOSFET of this embodiment, however, the thickness of the p-type doped layers 12a is extremely thin. Thus, it may be considered that the width of the depletion layer existing in the entire multilayer portion of the active region 12 is determined according to the impurity concentration of the undoped layers 12b. That is to say, as the impurity concentration is lower, the slope of the conduction band edge is generally gentler, and hence the width of the depletion layer is wider. Thus, the narrow p-type doped layers 12a are eroded from both ends thereof by the depletion layer expanding from the undoped layers 12b. Accordingly, the depletion layer expands throughout the multilayer portion in the active region. As a result, a high breakdown voltage for the source-drain voltage is obtained in the MOSFET of this embodiment.

Figure 3:
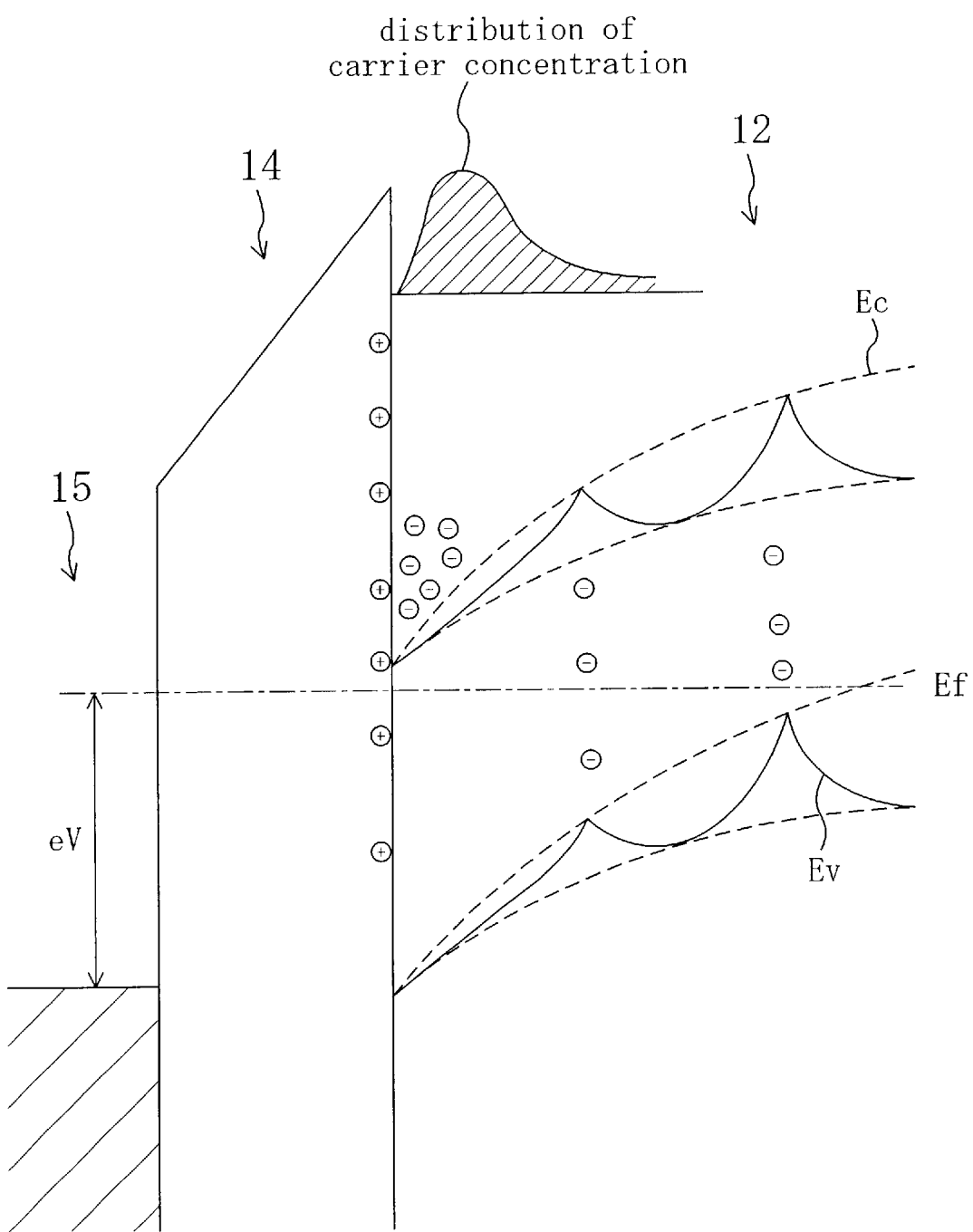
FIG. 3 is an energy band diagram in a gate electrode, a gate insulating film, and the active region, of the NMOSFET of the first embodiment when an inversion state are created.

FIG. 3 is an energy band diagram in the gate electrode 15, gate insulating film 14, and active region 12, of the NMOSFET of this embodiment when carriers flow with a positive voltage V applied to the gate electrode 15, i.e., in an inversion state.

In the inversion state shown in FIG. 3, electrons gather at the end of the conduction band edge that is bent downward by a potential eV corresponding to the applied voltage V. Moreover, these electrons flow in a region to be a channel layer in the active region 12 depending on the voltage difference between the source/drain regions 13a and 13b. In this case, carriers (electrons in this case) are distributed such that the concentration thereof immediately under the gate insulating film 14 is high while the concentration thereof lowers as they approach the bottom (see FIG. 3). Thus, in an actual device, most part of a channel layer located immediately under the gate insulating film 14 is occupied by an undoped layer 12b. However, since the undoped layers 12b are hardly doped with an impurity, scattering of impurity ions against carriers (electrons) flowing in the undoped layers 12b is reduced. That is to say, scattering of impurity ions that prevents carriers from flowing in the active region 12 is reduced. As a result, a high channel mobility is achieved.

In addition, in most cases, a gate insulating film of a MOSFET is an oxide film formed by a thermal treatment of a substrate. Thus, it is considered that a small number of charges are trapped in the gate insulating film 14 formed by thermally oxidizing the undoped layer 12b. For example, if a thermal oxide film is formed on a p-type SiC layer, a p-type impurity (such as Al or B) existing in the p-type SiC layer is incorporated into the oxide film. As a result, positive fixed charges are generated in the oxide film. On the other hand, if a thermal oxide film is formed on an n-type SiC layer, an n-type impurity (such as N or P) existing in the n-type SiC layer is incorporated into the oxide film, thereby generating negative fixed charges in the oxide film. However, in a structure including an active region as in this embodiment, the threshold value can be appropriately controlled even if the undoped layers 12b occupying most part of the channel layer include such a low concentration of impurity that is necessary for controlling the threshold value in a normal MOSFET. As a result, since the concentration of the impurity (which is Al of a p-type impurity in this embodiment) incorporated in the gate insulating film 14 due to thermal oxidization is low, the number of positive fixed charges generated in the gate insulating film 14 of a thermal oxide film decreases as compared to the known MOSFET. Charges (positive charges in this case) that are trapped in interface states existing near the interface with the undoped layer 12b located immediately under the gate insulating film 14 also decrease as compared to the case where the impurity concentration is high in some degree enough to control the threshold value as in a normal MOSFET.

Furthermore, as shown in FIG. 2(a), when negative charges are trapped in the impurity contained in the p-type doped layers 12a, electrons flow mainly in the undoped layers 12b where a small number of impurity ions are scattered during the operation of the MOSFET. As a result, as shown in FIG. 3, negative charges that remain in the multilayer portion of the active region 12 act as an agent to cancel the electric field created by the positive fixed charges in the gate insulating film or by the positive charges trapped near the interface between the gate insulating film and the active region. That is to say, charges trapped in the impurity (aluminum atoms in this embodiment) in the p-type doped layer 12a compensate the function of charges trapped in the gate insulating film or near the interface between the gate insulating film and the active region, and carriers are less prevented from flowing. As a result, the channel mobility increases.

In a PMOSFET in which a channel layer contains an n-type impurity, positive charges trapped in an impurity contained in a heavily doped layer (a δ-doped layer) can compensate the function of negative charges trapped in the gate insulating film or near the interface between the gate insulating film and the active region.

By the effects of the increased channel mobility and the increased breakdown voltage due to the above-described process, a low ON-state resistance with a high breakdown voltage, a large current capacitance, and a high transconductance are achieved so that a MOSFET having the advantages of low power consumption and a high gain can be formed successfully. Consequently, in accordance with this embodiment, an RF characteristic is expected to improve due to the increased channel mobility.

Note that, in this embodiment, the uppermost layer of the multilayer portion in the active region 12 is the undoped layer 12b with a thickness of 50 nm, however, the present invention is not limited to this particular embodiment. For example, the uppermost layer of the multilayer portion in the active region may be an undoped layer with a thickness ranging from about 50 nm to about 200 nm. The thickness of this uppermost layer can be appropriately adjusted by giving priority to either the breakdown voltage characteristic or the amount of current.

The effects as described above can be obtained by providing lightly doped layers (p-type lightly doped layers in this embodiment) instead of the undoped layers in the active region. This case will be described later.

Hereinafter, a fabricating process of a MOSFET according to this embodiment will be described. FIGS. 4(a) through 4(d) are cross-sectional views showing fabricating process steps of an NMOSFET according to this embodiment. An apparatus and a method for alternately stacking undoped layers (lightly doped layers) and heavily doped layers (δ-doped layers) using 6H-SiC layers were specifically disclosed in the specification and drawings of Japanese Patent Application 2000-58964.

Figure 4A:
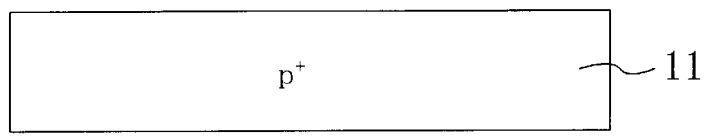
FIGS. 4(a) through 4(d) are cross-sectional views showing fabricating process steps of the NMOSFET of the first embodiment.

In the process step shown in FIG. 4(a), a p-type SiC substrate 11 is prepared. The SiC substrate 11 is a 4H-SiC substrate whose principal surface is a {11–20} plane (i.e., an A-plane). Alternatively, a SiC substrate whose principal surface is inclined from a (0001) plane (i.e., a C-plane) by several degrees may be used. The diameter of the SiC substrate 11 is 25 mm. First, the SiC substrate 11 is thermally oxidized at 1100° C. for about 3 hours within water vapor environment that has been bubbled with oxygen at a flow rate of 5 (l/min), thereby forming a thermal oxide film to a thickness of about 40 nm on the surface thereof. Thereafter, the thermal oxide film is removed with buffered hydrofluoric acid (which is a mixture of hydrofluoric acid and aqueous solution of ammonium fluoride at a ratio of 1:7). Then, the SiC substrate 11 is placed in a chamber of a CVD apparatus and the pressure inside the chamber is reduced to create a vacuum at a pressure of about $10^{-6}$ Pa ($\approx 10^{-8}$ Torr).

Figure 4B:
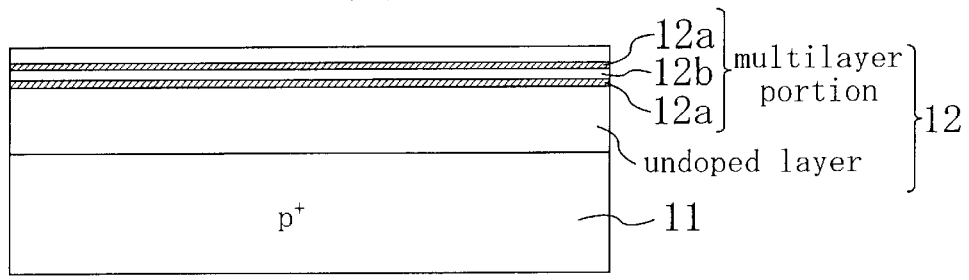

Next, in the process step shown in FIG. 4(b), hydrogen and argon gases are supplied as diluting gases into the chamber at respective flow rates of 2 (l/min) and 1 (l/min), thereby raising the pressure inside the chamber to 0.0933 MPa and controlling the temperature of the substrate at about 1600° C. Then, propane and silane gases are supplied as source gases into the chamber at respective flow rates of 2 (ml/min) and 3 (ml/min) with the flows of hydrogen and argon gases still kept constant at the rates mentioned above. These source gases have been diluted with hydrogen gas at a flow rate of 50 (ml/min). At this time, a pulse valve for supplying a doping gas is completely closed. In this manner, an undoped layer 12b (a lightly doped layer) of undoped SiC single crystals is grown epitaxially on the principal surface of the SiC substrate 11 to a thickness of about 1500 nm.

As disclosed in the specification and drawings of Japanese Patent Application 2000-58964, in order to supply the hydrogen gas containing, for example, about 10% trimethylaluminum $(Al(CH_3))_3$ as a doping gas, the doping gas is stored in a high-pressure cylinder, and a pulse valve is provided between the high-pressure cylinder and a pipe for supplying the doping gas.

Next, a pulsed gas, containing aluminum as a p-type impurity (i.e., a doping gas), is supplied into the chamber by opening the pulse valve while conditions, such as the amount of the diluting and source gases to be supplied into the chamber and the temperature, are still kept constant, thereby forming a p-type doped layer 12a (a heavily doped layer) to a thickness of about 10 nm on the principal surface of the SiC substrate 11. In this manner, the pulsed doping gas can be supplied to a space directly above the SiC substrate 11 in the chamber by repeatedly opening and closing the pulse valve while continuously supplying the source and diluting gases.

When the epitaxial growth of the p-type doped layer 12a is completed, propane and silane gases are supplied to a space above the SiC substrate 11 by halting the supply of the doping gas, i.e., with the pulse valve completely closed, thereby epitaxially growing an undoped layer 12b (lightly doped layer) of an undoped SiC single crystals on the principal surface of the SiC substrate 11 to a thickness of about 50 nm.

Each of the step of forming a p-type doped layer 12a by thus introducing a doping gas (a hydrogen gas containing trimethylaluminum) through the opening and closing of the pulse valve, while concurrently supplying the source gases, and the step of forming an undoped layer 12b by thus supplying only the source gases without supplying the doping gas, while keeping the pulse valve closed, is repeated forty times. Consequently, a multilayer portion, in which five p-type doped layers 12a and five undoped layers 12b are alternately stacked, is formed in an active layer 12. In the multilayer portion that occupies the upper part of the active region 12, i.e., the stack of the δ-doped layers each having a thickness of 10 nm and the undoped layers each having a thickness of 50 nm, the average concentration of aluminum is about $1 \times 10^{17}$ atoms·cm$^{-3}$. This multilayer portion has a total thickness of 300 nm after subjected to thermal oxidation. At this time, the uppermost layer of the multilayer portion is the undoped layer 12b.

This undoped layer 12b, which is the uppermost layer of the multilayer portion, may be thicker than other undoped layers 12b by about 50 nm. In such a case, since the threshold voltage of the MOSFET increases, the thickness of the uppermost undoped layer 12b is determined so that the channel mobility and the threshold voltage, harmfully affected by interface states present at the interface between the gate insulating film and the active region, are appropriately adjusted to desired conditions.

Figure 4C:
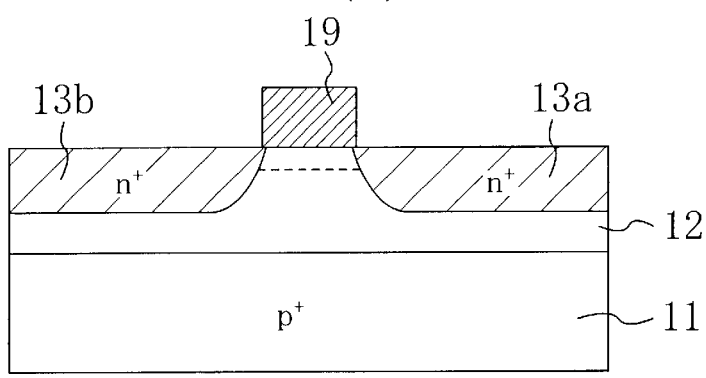

Then, in the process step shown in FIG. 4(c), an implant mask 19 of silicon dioxide, for example, is formed on the active region 12 so as to cover a region on which a gate electrode is to be formed and not to cover regions to be source/drain regions. Subsequently, the substrate is heated to a temperature between 500° C. and 800° C. and then ion implantation of nitrogen are performed from above the implant mask 19. Thereafter, annealing for activating impurity is performed at 1500° C. for 10 minutes, thereby forming source/drain regions 13a and 13b containing an n-type impurity at a concentration of about $1 \times 10^{18}$ atoms·cm$^{-3}$. Specifically, the source/drain regions 13a and 13b are formed by implanting ions multiple times at 500° C. with accelerating voltages and at doses of: 30 keV and $5 \times 10^{13}$ atoms·cm$^{-2}$; 60 keV and $6 \times 10^{13}$ atoms·cm$^{-2}$; 100 keV and $8 \times 10^{13}$ atoms·cm$^{-2}$; 110 keV and $5 \times 10^{13}$ atoms·cm$^{-2}$; 130 keV and $10 \times 10^{13}$ atoms·cm$^{-2}$; 180 keV and $15 \times 10^{13}$ atoms·cm$^{-2}$; and 240 keV and $10 \times 10^{13}$ atoms·cm$^{-2}$, respectively, for example.

Figure 4D:
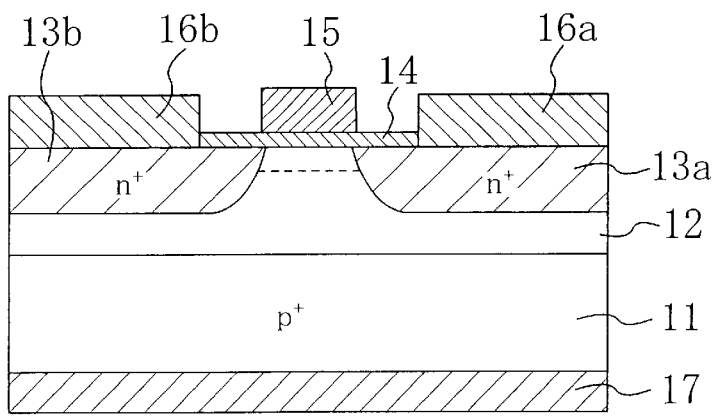

Thereafter, in the process step shown in FIG. 4(d), after the implant mask 19 has been removed, the surface layer of the active region 12 is cleaned by RCA cleaning, for example, and then the surface part (whose thickness is about 15 nm) of the uppermost undoped layer 12b in the active region 12 is thermally oxidized at about 1100° C., thereby forming a gate insulating film 14 made of a thermal oxide film with a thickness of about 30 nm. Then, parts of the gate insulating film 14 located on the source/drain regions 13a and 13b are removed so that openings are created, and then source/drain electrodes 16a and 16b made of an Ni alloy film is formed in the openings by a vacuum evaporation method. Thereafter, annealing is performed at 1000° C. for 3 minutes so that the source/drain electrodes 16a and 16b can make an ohmic contact with the active region 12. Subsequently, Ni is evaporated over the gate insulating film 14, thereby forming a gate electrode 15 that is made of an Ni film and has a gate length of about 5 $\mu$m.

For the MOSFET formed by the process steps described above, the dependence of the relationship between drain current and drain voltage (i.e., I-V characteristics) on gate voltage was examined. By applying a constant voltage between the source/drain electrodes 16a and 16b and a voltage to the gate electrode 15, a switching operation was performed due to an appropriate source-to-drain I-V characteristics in accordance with the voltage applied to the gate electrode 15. In the NMOSFET of this embodiment, a stable drain current was obtained without a breakdown even when the drain voltage was 200 V or higher. The dielectric breakdown voltage in the OFF state was 600 V or higher and ON-state resistance was reduced to 1 m$\Omega\cdot$cm$^2$.

Figure 12:
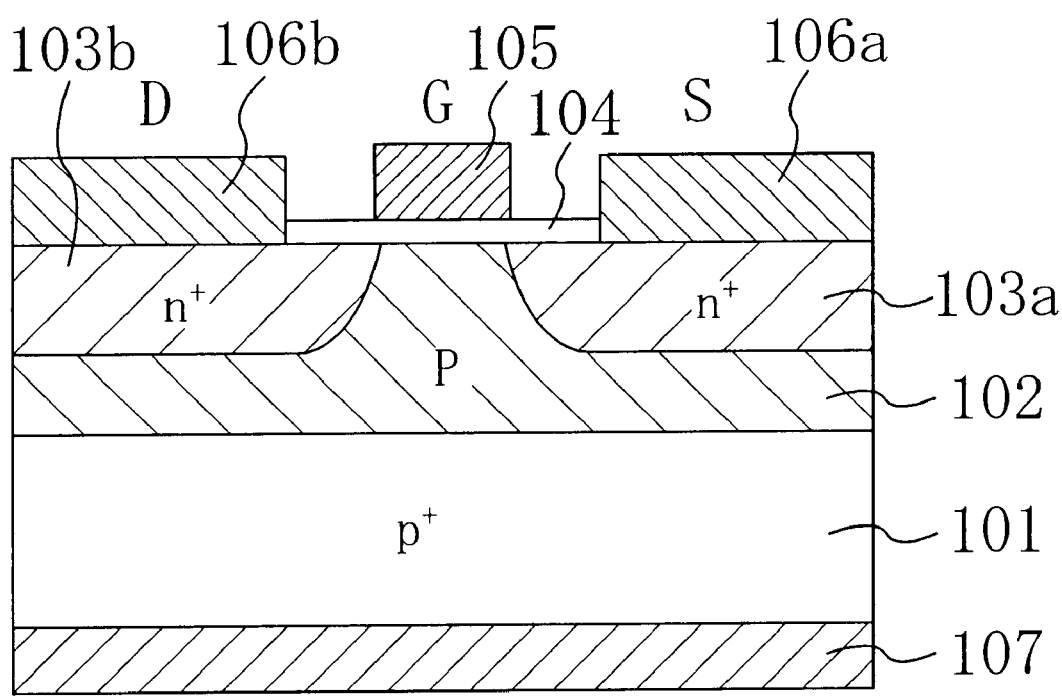
FIG. 12 is a cross-sectional view schematically showing the structure of a known NMOSFET using silicon carbide (SiC).
Figure 13:
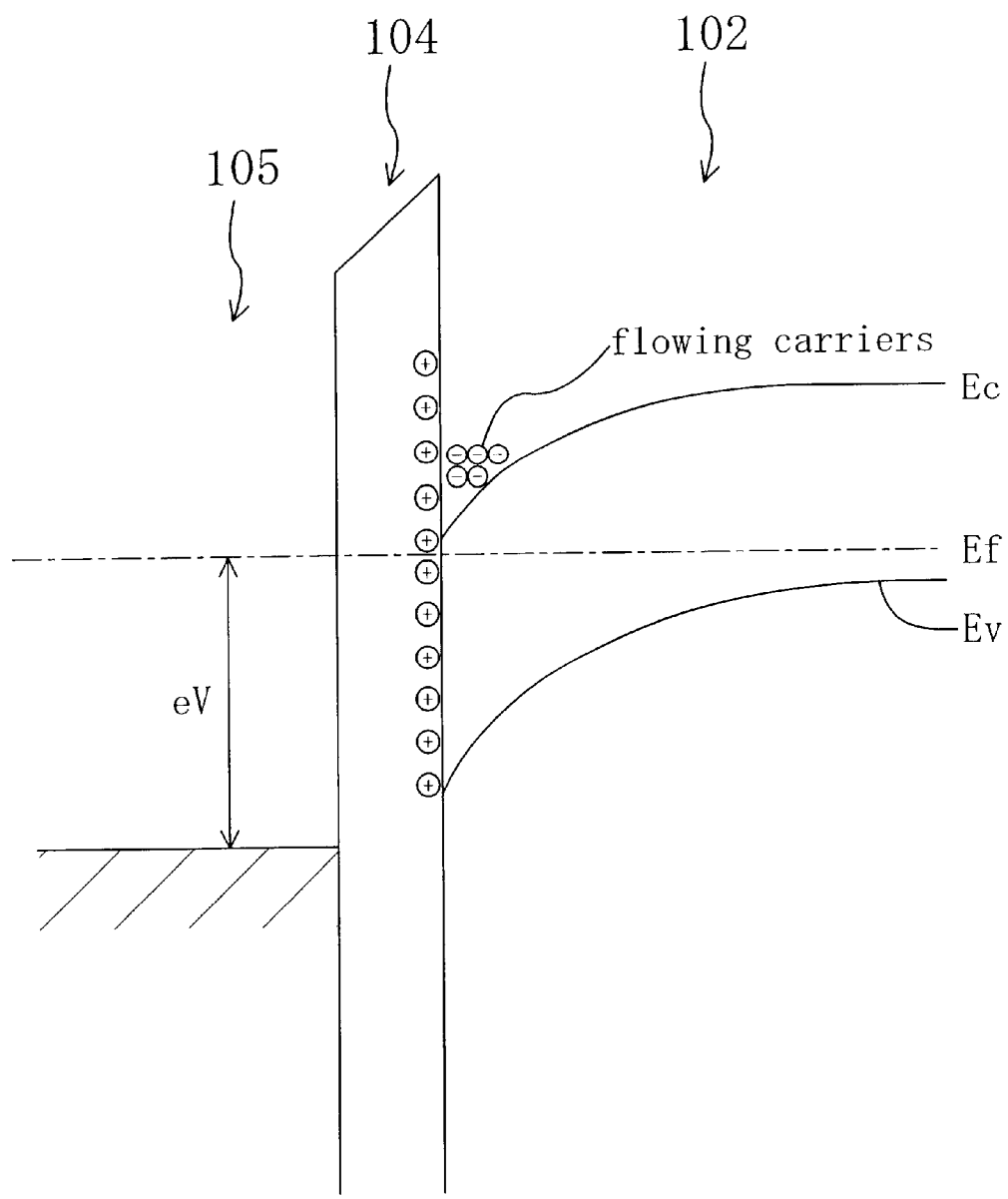
FIG. 13 is an energy band diagram in gate electrode, gate insulating film, and doped channel SiC layer, of the known NMOSFET when an inversion state is created.

Also, transconductances of a known MOSFET with the structure shown in FIG. 12 (where the impurity concentration in the p-type doped channel SiC layer 102 is 1×10$^{17}$ cm$^{-3}$) and the MOSFET of this embodiment were measured for comparison. As a result, it was found that the transconductance of the MOSFET of this embodiment was about three times higher than that of the known MOSFET.

That is to say, it was confirmed that a high transconductance is achieved owing to the effect of the increased channel mobility in the NMOSFET of this embodiment as described above.

Modified Example of Embodiment 1

It is also possible to fabricate a PMOSFET with a high channel mobility by applying the structure of the NMOSFET shown in FIG. 1.

In this case, if the conductivity type of each part of this PMOSFET is opposite to that of the counterpart in the first embodiment, the function of negative charges trapped near the interface between a gate insulating film and an active region can be compensated.

That is to say, n-type SiC substrate; n-type doped layers formed as δ-doped layers containing an n-type impurity (e.g., nitrogen) at high concentration; and p-type source/drain regions defined by implanting a p-type impurity (e.g., aluminum) may be provided, instead of the p-type SiC substrate 11; p-type doped layers; and n-type source/drain regions 13a and 13b, shown in FIG. 1. Then, because of the basic effect of the multilayer structure in which the n-type doped layers, as δ-doped layers, and the undoped layers are stacked, the channel mobility increases due to decrease in scattering of impurity ions and breakdown voltage characteristic also improves.

Figure 5A:
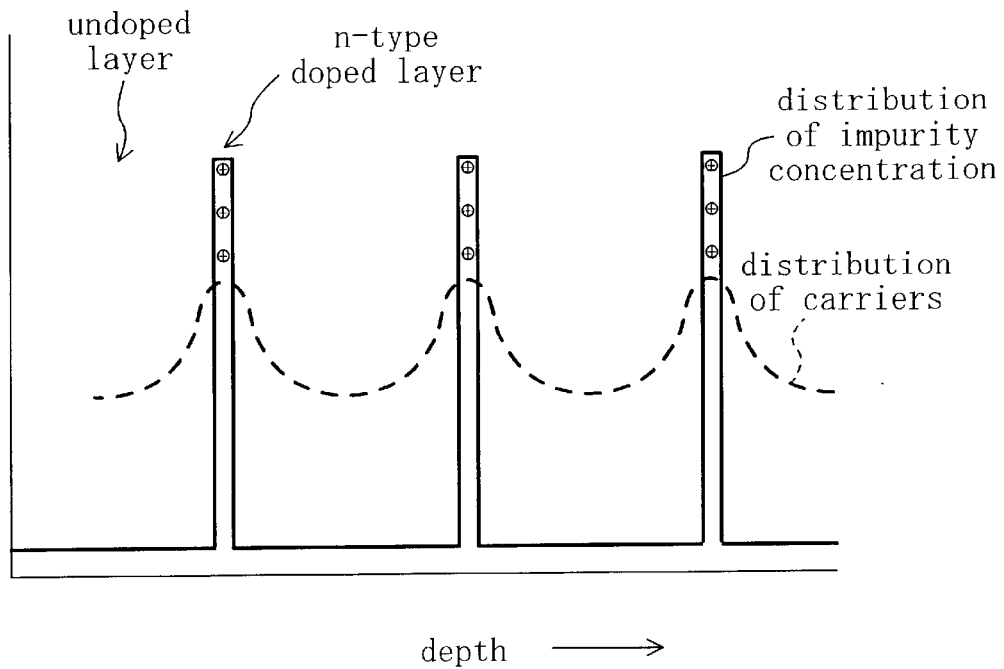
FIG. 5(a) schematically shows the relationship between the concentration profile of nitrogen and the distribution of carriers along the depth of an active region according to a first modified example of the first embodiment.
Figure 5B:
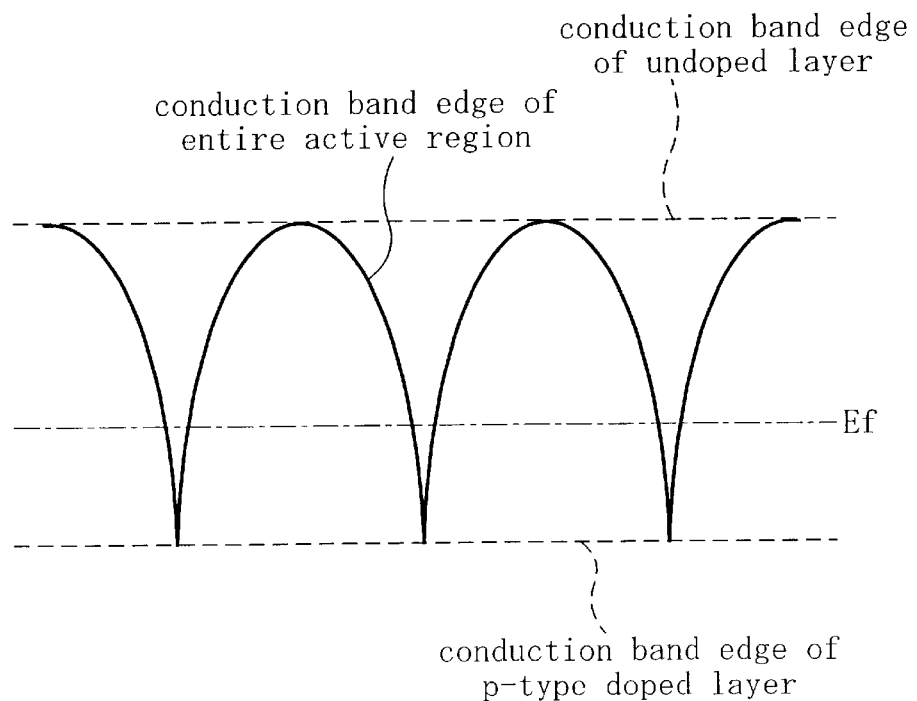
FIG. 5(b) is a partial band diagram showing the configuration of a conduction band edge along the depth of the active region.

FIG. 5(a) schematically shows the relationship between the concentration profile of nitrogen, as an n-type impurity, and the distribution of carriers along the depth of an active region according to this example. FIG. 5(b) is a partial band diagram showing the configuration of a conduction band edge along the depth of the active region.

As shown in FIG. 5(a), a small number of impurity ions are scattered in the undoped layers, and a high electron mobility is achieved especially in the undoped layers. As shown in FIG. 5(b), the conduction band edge in the entire active region has a configuration connecting the conduction band edge in the n-type doped layers to the conduction band edge in the undoped layers, respectively indicated by the broken lines. When a depletion layer is created throughout the active region, carriers do not exist in the undoped layers and n-type doped layers. As a result, high breakdown voltage characteristic is exhibited as in the first embodiment.

Figure 6:
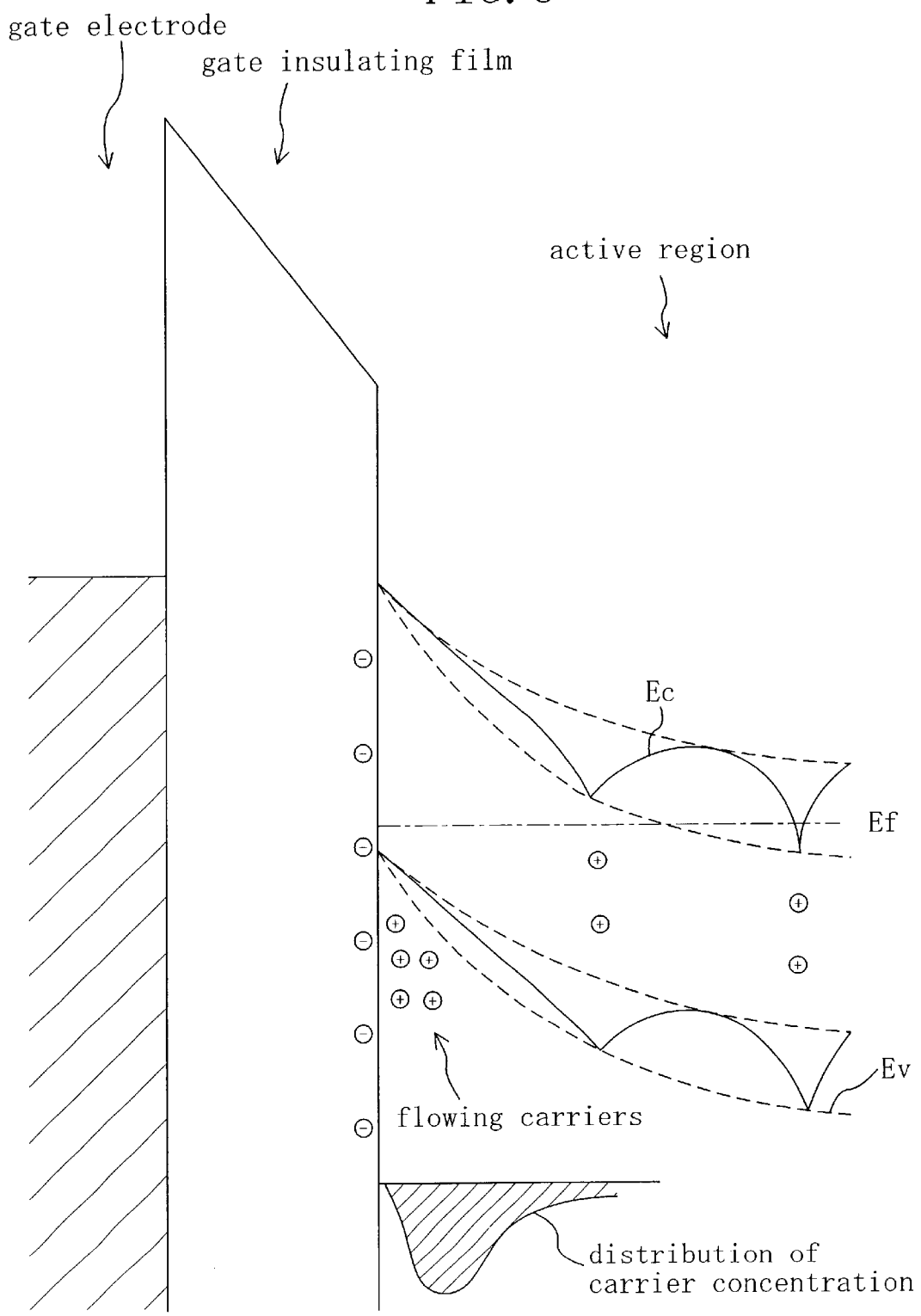
FIG. 6 is an energy band diagram showing the energy band structure in an inversion state in a PMOSFET according to the modified example of the first embodiment.

FIG. 6 is an energy band diagram in a gate electrode, a gate insulating film and the active region when carriers flow, i.e., in an inversion state, with a positive voltage V applied to the substrate in the PMOSFET of this example.

In the inversion state shown in FIG. 6, holes gather at the end of the valence band edge that has been bent upward by a potential eV corresponding to the applied voltage V, and then these holes flow in a region to be a channel layer in the active region depending on the voltage difference between source/drain regions. In this case, carriers (holes in this case) are distributed such that the concentration thereof immediately under the gate insulating film is high while the concentration thereof lowers as they approaches the bottom (see FIG. 6). As a result, a high channel mobility is achieved by the same process as already described for the NMOSFET.

In addition, fixed charges existing in the gate insulating film, formed by thermally oxidizing an undoped layer containing an impurity of low concentration, decrease in number, and thus effect on the holes flowing in the channel layer is reduced. As a result, the channel mobility increases. As shown in FIG. 5(a), since the thickness of the n-doped layers is as thin as about 10 nm, a quantum state resulting from a quantum effect occurs in the n-type doped layers when potential is enhanced in the active region and carriers flow therein. This potential barrier has a slope gently inclined to a certain degree and wave function of electrons existing locally in potential wells expands to a certain degree. As a result, positive charges are trapped in the impurity contained in the n-type doped layers. The same effects as already described for the NMOSFET also occur because of the positive charges trapped in the impurity contained in the n-type doped layers. Accordingly, the function of the negative charges trapped in the gate insulating film or near the interface between the gate insulating film and active region is compensated, and thus the channel mobility also increases.

Embodiment 2

Next, a second embodiment of the present invention for an ACCUFET (Accumulation Mode FET) that operates as a switching transistor for a large current and utilizes a multilayer structure in which δ-doped layers and undoped layers are stacked, will be described.

Figure 7:
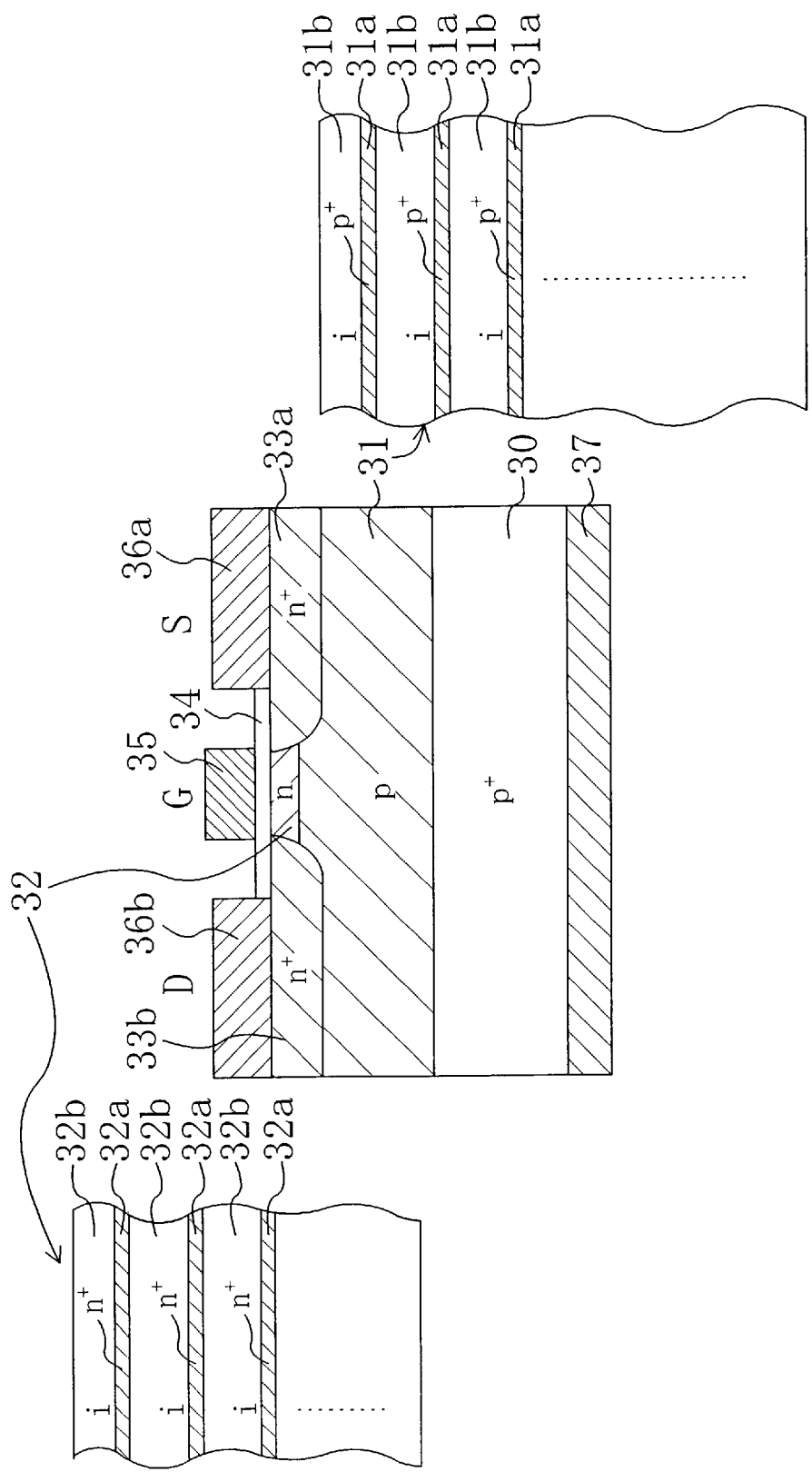
FIG. 7 shows cross-sectional views illustrating the structure of an ACCUFET according to a second embodiment of the present invention.

FIG. 7 shows cross-sectional views illustrating the structure of an ACCUFET according to this embodiment. FIG. 7 shows p-type lower active region 31 doped with aluminum at an average concentration of about 1×10$^{17}$ atoms·cm$^{-3}$ and formed on a p-type SiC substrate 30 doped with aluminum (a p-type impurity) at a concentration of 1×10$^{18}$ atoms·cm$^{-3}$; n-type upper active region 32 formed on the lower active region 31 and doped with nitrogen at an average concentration of about 1×10$^{17}$ atoms·cm$^{-3}$; n-type source/drain regions 33a and 33b formed by implanting nitrogen at a concentration of 1×10$^{18}$ cm$^{-3}$ into the upper and lower active regions 32 and 31; gate insulating film 34 of SiO$_2$ formed on the upper active region 32; gate electrode 35 made of an Ni alloy film and formed on the gate insulating film 34; source/drain electrodes 36a and 36b made of an Ni alloy film in ohmic contact with the respective source/drain regions 33a and 33b; and backside electrode 37 made of an Ni alloy film in ohmic contact with the back surface of the SiC substrate 30.

As shown in the right part of FIG. 7 under magnification, the lower active region 31 is formed by alternately stacking about forty p-type doped layers 31a each containing aluminum at a high concentration (e.g., $1\times10^{18}$ atoms·cm$^{-3}$) and having a thickness of about 10 nm and about forty undoped layers 31b each made of undoped SiC single crystals and having a thickness of about 50 nm. Thus, the total thickness thereof is about 2400 nm. The p-type doped layers 31a are formed sufficiently thin to allow spreading of carriers to the undoped layers 31b under a quantum effect. Accordingly, negative charges are trapped in the p-type doped layers 31a due to the spreading of carriers, as shown in FIG. 3(a).

On the other hand, as shown in the left part of FIG. 7 under magnification, the upper active region 32 is formed by alternately stacking about five n-type doped layers 32a each containing nitrogen at a high concentration (e.g., $1\times10^{18}$ atoms·cm$^{-3}$) and having a thickness of about 10 nm and about five undoped layers 32b each made of undoped SiC single crystals and having a thickness of about 50 nm. That is to say, the total thickness thereof is about 300 nm. Accordingly, a quantum level occurs in the n-type doped layers 32a under a quantum effect so that the wave function of electrons, existing locally in the n-type doped layers 32a, expands to a certain degree. Thus, it is found that electrons are distributed not only in the n-type doped layers 32a but also in the undoped layers 32b, as indicated by the broken curve in FIG. 5. When potential is enhanced in the upper active region 32 under this distribution, electrons spread out from the n-type doped layer 32a to the undoped layers 32b under a quantum effect. In this state, electrons are continuously supplied to the n-type doped layers 32a and undoped layers 32b. Since electrons flow in the undoped layers 32b where the impurity concentration is low, a high channel mobility can be achieved by the reduction in scattering of impurity ions. On the other hand, in the OFF state, a depletion layer is created throughout the upper active region 32 and no electron exists in the upper active region 32. Thus, a breakdown voltage is fixed by the undoped layers 32b where the impurity concentration is low, and a high breakdown voltage is obtained throughout the upper active region 32. Accordingly, a high channel mobility and a high breakdown voltage can be achieved at the same time in the ACCUFET in which a large current flows between the source/drain regions 33a and 33b utilizing the upper active region 32.

As shown in FIG. 5(a), the impurity concentration is low in the undoped layers 32b. Thus, if the upper active region 32 is used as a channel layer, the channel mobility increases due to the reduction in charges trapped in the gate insulating film 34 or near the interface between the gate insulating film and the upper active region 32 and due to the reduction in scattering of impurity ions, and higher breakdown voltage characteristic can be achieved.

In addition, with respect to the ACCUFET of this embodiment, the dependence of I-V characteristics (i.e., the relationship between drain current and drain voltage) on gate voltage was examined. Then, it was found that the saturation amount of current further increases as compared to the NMOSFT of the first embodiment. Moreover, a stable drain current was obtained without a breakdown even when the drain voltage was 400 V or higher. The dielectric breakdown voltage in the OFF state was 600 V or higher and ON-state resistance was reduced to 1 mΩ·cm$^2$.

In particular, the ACCUFET has a feature of high saturation value of current and low ON-state resistance, but also has a drawback of poor breakdown voltage characteristic in the OFF-state, thus being one of the main reasons why the ACCUFET has not been practically applied. However, since the ACCUFET of this embodiment utilizes the multilayer structure in which the δ-doped layers and undoped layers are stacked as described above, high breakdown voltage characteristic is exhibited in the OFF state, resulting in considerable progress for its practical application.

Description of a process for fabricating the ACCUFET of this embodiment is omitted because the process is basically the same as that for fabricating the NMOSFET of the first embodiment.

In this embodiment, the lower active region 31 is formed by alternately stacking the δ-doped layers and undoped layers. However, this lower active region is not necessarily provided. Instead of the lower active region, a lightly doped layer in which the impurity concentration is uniform or an undoped layer may be provided. However, if the lower active region 31 is formed by alternately stacking the δ-doped layers and undoped layers, the breakdown voltage further increases in the lower region of a channel.

Modified Example of Embodiment 2

Figure 8:
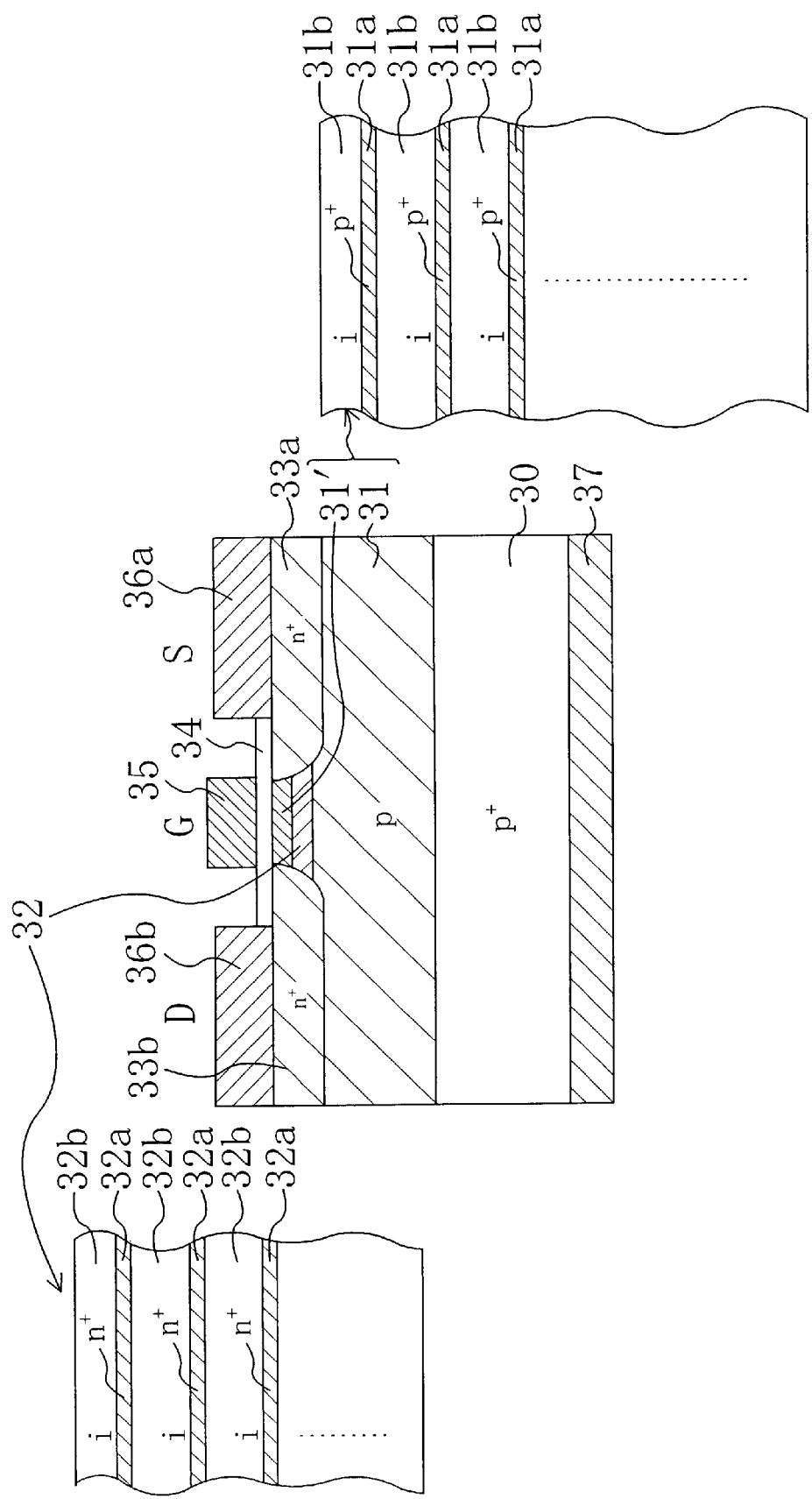
FIG. 8 shows cross-sectional views illustrating the structure of an ACCUFET according to a first modified example of the second embodiment.

FIG. 8 shows cross-sectional views illustrating the structure of an ACCUFET according to this example. In this example, the ACCUFET of the second embodiment shown in FIG. 7 includes an active region that is formed on the upper active region 32 and has the same structure as the lower active region 31. In other words, this ACCUFET includes an underlying active region 31' formed by stacking three p-type doped layers 31a and three undoped layer 31b. Other structures of the ACCUFET of this example are the same as those of the ACCUFET of the second embodiment shown in FIG. 7.

In the ACCUFET of this example, the upper active region 32 acts as a channel layer, as in the second embodiment, and an undoped layer 31b, containing an impurity at low concentration, in the underlying active region 31' is located immediately under the gate insulating film 34. Thus, the channel mobility increases because a small number of charges are trapped in the gate insulating film 34 or near the interface between the gate insulating film and the upper active region and because scattering of impurity ions is suppressed. Furthermore, breakdown voltage increases because a depletion layer expands throughout the channel layer in the OFF state.

When a potential is enhanced, negative charges are trapped in the impurity contained in the p-type doped layers 31a in the underlying active region 31' as shown in FIG. 2(a). Thus, the function of positive charges trapped near the interface between the gate insulating film 34 and the underlying active region 31' is compensated, resulting in further increase in channel mobility. In particular, since the p-type doped layer 31a of the underlying active region 31' which contains the impurity in which negative charges are trapped is located immediately under the gate insulating film 34, the effect of compensating for the function of positive charges, trapped near the interface between the gate insulating film 34 and the underlying active region 31', is remarkably exhibited as compared to the second embodiment.

Embodiment 3

Next, a third embodiment of the present invention for a vertical MOSFET utilizing a multilayer structure in which δ-doped layers and undoped layers are stacked.

Figure 9A:
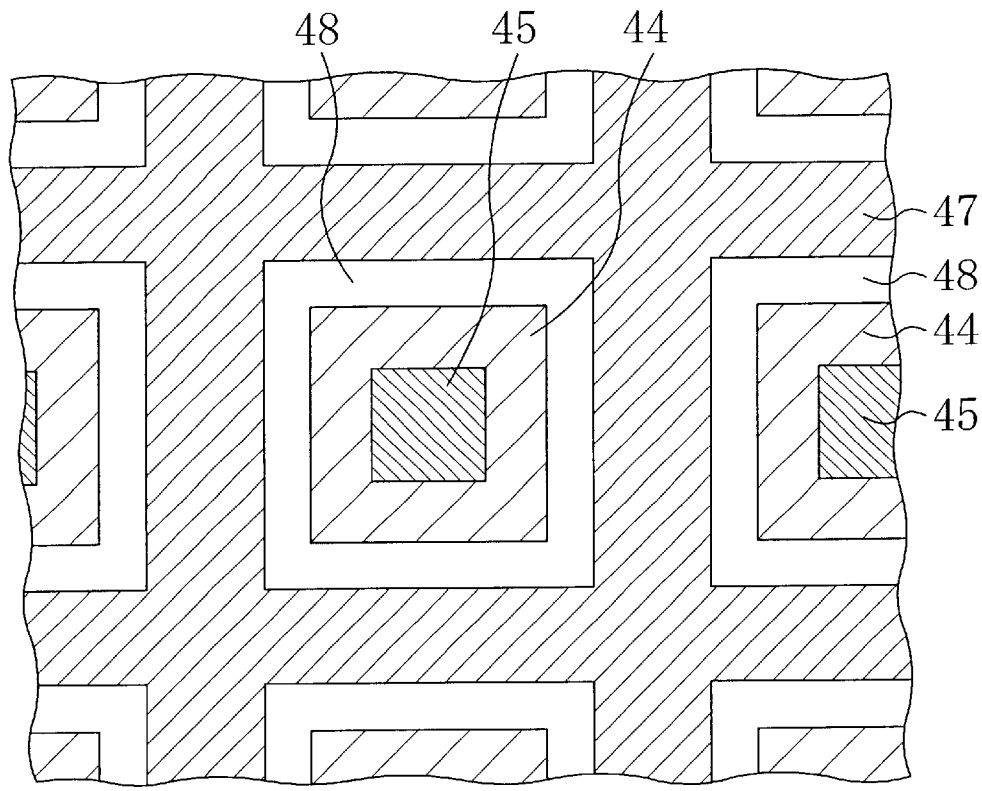
FIGS. 9(a) and 9(b) are respectively a plan view and a cross-sectional view of a vertical power MOSFET according to a third embodiment of the present invention.
Figure 9B:
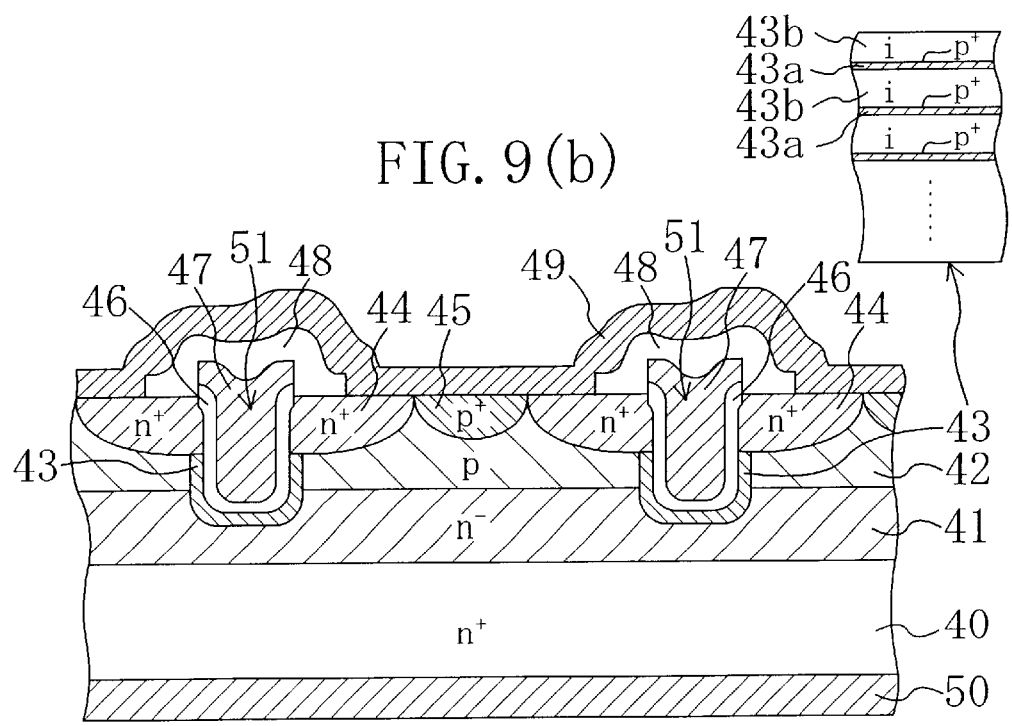

FIGS. 9(a) and 9(b) are respectively a plan view and a cross-sectional view of a vertical power MOSFET according to this embodiment. FIG. 9(a) shows a planar structure when a source electrode 49 is removed and an interlevel dielectric film 48 is treated as a transparent body.

As shown in FIGS. 9(a) and 9(b), a vertical power MOSFET of this embodiment has a structure in which a large number of cells are arranged in matrix. The MOSFET includes: an n-type SiC substrate 40 doped with nitrogen (an n-type impurity) at a concentration of $1\times10^{18}$ atoms·cm$^{-3}$; an n$^-$-type SiC layer 41 formed on the SiC substrate 40 and doped with nitrogen at a concentration of about $2\times10^{17}$ atoms·cm$^{-3}$; a p-type SiC layer 42 formed on the n$^-$-type SiC layer 41 and doped with nitrogen at a concentration of about $1\times10^{16}$ atoms·cm$^{-3}$; n$^+$-type source regions 44, which are defined in the p-type SiC layer 42 by implanting ions and contain nitrogen at a concentration of about $1\times10^{18}$ atoms·cm$^{-3}$; p$^+$-type contact regions 45, which are defined in the p-type SiC layer 42 by implanting ions, are sandwiched between the source regions 44 of respective adjacent cells, and contain aluminum at a concentration of about $1\times10^{18}$ atoms·cm$^{-3}$; a trench 51, which reaches into the n$^-$-type SiC layer 41 through the p-type SiC layer 42; an active region 43, surrounding the side faces and the bottom of each of the trench 51, is made of a stack of δ-doped layers and undoped layers, and contains aluminum at an average concentration of about $2\times10^{17}$ atoms·cm$^{-3}$; a gate insulating film 46 of SiO$_2$ formed on the active region 43; a gate electrode 47 of polysilicon formed on the gate insulating film 46; an interlevel dielectric films 48, which covers the gate electrode 47; a source electrode 49 of an Ni alloy which is formed over the substrate and is in contact with the n$^+$-type source regions 44 and the p$^+$-type contact regions 45 of the respective cells; and a drain electrode 50 of an Ni alloy covering the back surface of the SiC substrate 40.

The active region 43 formed by alternately stacking five p-type doped layers 43a each containing aluminum at a high concentration (e.g., $1\times10^{18}$ atoms·cm$^{-3}$) and having a thickness of about 10 nm; and five undoped layer 43b each made of undoped SiC single crystals and having a thickness of about 50 nm. Thus, a total thickness thereof is about 300 nm. The p-type doped layers 43a are formed sufficiently thin to allow spreading of carriers to the undoped layers 43b under a quantum effect. Accordingly, negative charges are trapped in the p-type doped layers 43a due to the spreading of carriers, as shown in FIG. 2(a).

In the vertical power MOSFET of this embodiment, when a voltage is applied between the source/drain electrodes 49 and 50 with a bias applied to the polysilicon gate electrode 47, carriers (electrons) flow in the active region 43 interposed between the gate insulating film 46 and the p-type SiC layer 42 or n$^-$-type SiC layer 41. A current flowing between the source/drain regions is modulated in accordance with a voltage applied to the gate electrode 47 so that a switching operation is performed. In this case, as described in the first embodiment, a smaller number of charges are trapped in the gate insulating film 46 or near the interface between the gate insulating film and the active region, thus increasing the channel mobility. In addition, since the undoped layers 43b, occupying most part of the active region 43, contain a small amount of impurity, the channel mobility increases due to the reduction in scattering of impurity ions and a breakdown voltage also increases. Furthermore, since negative charges are trapped in the impurity contained in the p-type doped layers 43a in the active region 43, the function of positive charges trapped near the interface between the gate insulating film 46 and the active region 43 is compensated, thus further increasing the channel mobility.

In this case, a stable drain current is obtained without a breakdown even when the drain voltage is 700 V or higher.

It is found that the dielectric breakdown voltage in the OFF state is 1000 V or higher. Also, the transconductance in the vicinity of the threshold voltage is about three times higher than that when a uniformly doped active region is provided and ON-state resistance is reduced. As a result, characteristics can be improved, for example, the channel mobility increases by about three times higher than before. That is to say, a MOSFET having the advantages of low current consumption, a low voltage drive and a high gain can be achieved.

Hereinafter, process steps for fabricating a vertical power MOSFET according to this embodiment will be described. FIGS. 10(a) through 10(c) and FIGS. 11(a) through 11(c) are cross-sectional views showing process steps for fabricating the vertical MOSFET of this embodiment.

Figure 10A:
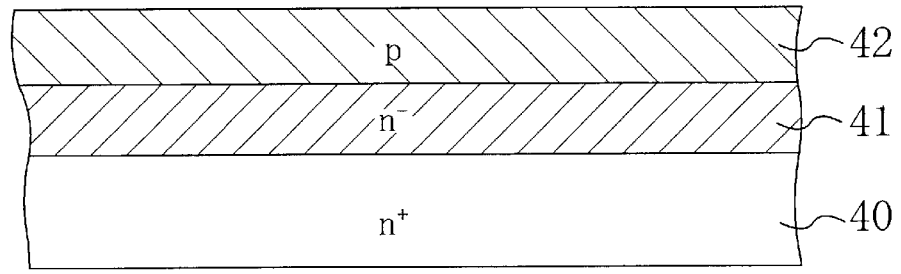
FIGS. 10(a) through 10(c) are cross-sectional views showing process steps for fabricating the vertical MOSFET of the third embodiment that are performed until the formation of an active region made of a stack of δ-doped layers and undoped layers.

First, in the process step shown in FIG. 10(a), the n$^-$-type SiC layer 41 is epitaxially grown on the n-type SiC substrate 40 during the in situ doping of nitrogen at a concentration of $2\times10^{17}$ atoms·cm$^{-3}$. Thereafter, the p-type SiC layer 42 is epitaxially grown during the in situ doping of aluminum at a concentration of $1\times10^{16}$ atoms·cm$^{-3}$.

Figure 10B:
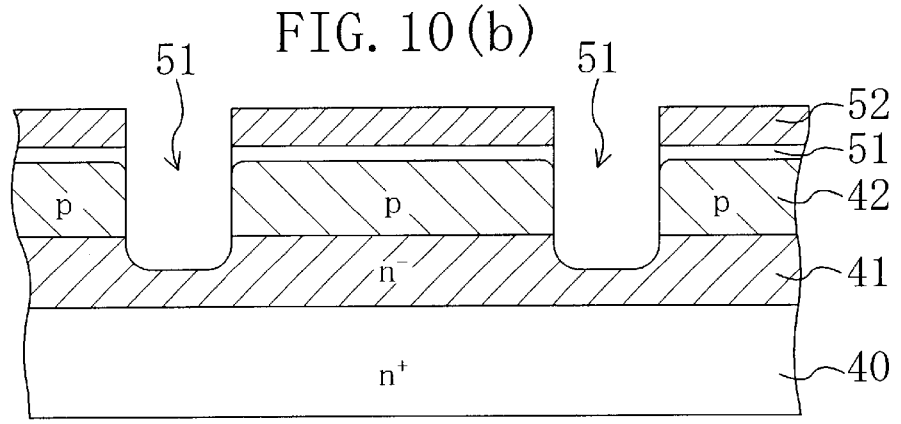

Next, in the process step shown in FIG. 10(b), an etching mask, which is made of the silicon dioxide film 51 and an Ni film 52 and has an opening in a trench region, is formed, and then reactive ion etching is performed using CF$_4$ and O$_2$ as source gases, thereby forming a trench 51 that reaches into the n$^-$-type SiC layer 41 through the p-type SiC layer 42.

Figure 10C:
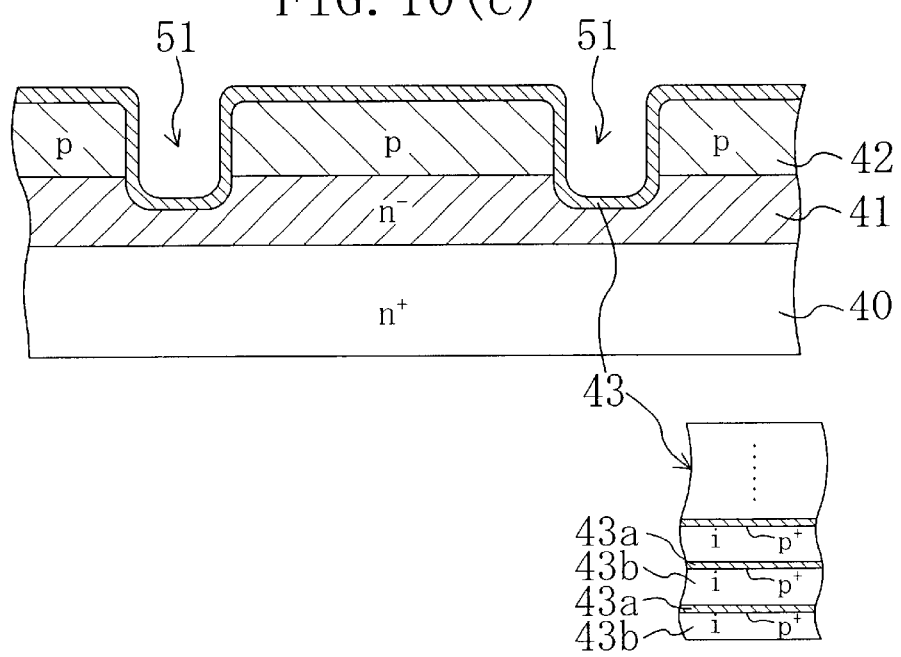

Then, in the process step shown in FIG. 10(c), according to the procedure described in the first embodiment, each of the step of forming a p-type doped layer 43a by introducing a doping gas (a hydrogen gas containing trimethylaluminum) through the opening and closing of a pulse valve, while concurrently supplying source gases, and the step of forming an undoped layer 43b by supplying only the source gases without supplying the doping gas, while keeping the pulse valve closed, is repeated five times. Consequently, an active region 43, in which five p-type doped layers 43a and five undoped layers 43b are alternately stacked, are formed. In the active region 43, the average concentration of aluminum is about $1\times10^{17}$ atoms·cm$^{-3}$ and the total thickness thereof is 300 nm.

Figure 11A:
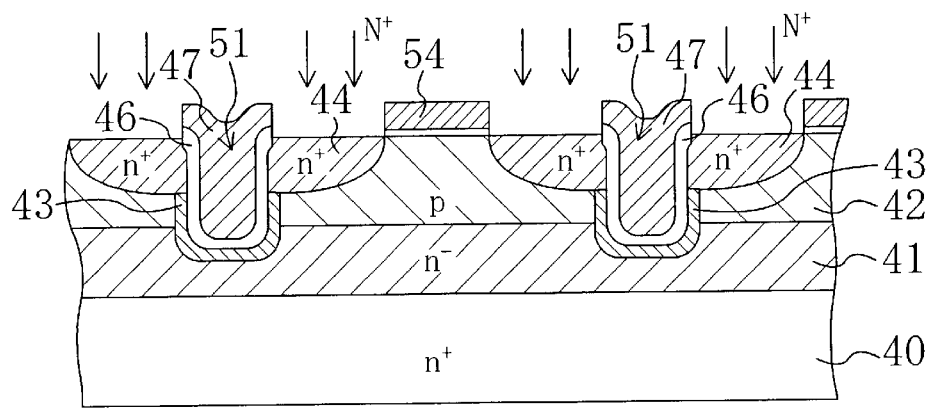
FIGS. 11(a) through 11(c) are cross-sectional views showing process steps for fabricating the vertical MOSFET of the third embodiment that are performed after the formation of the active region made of the stack of δ-doped layers and undoped layers.

Subsequently, in the process step shown in FIG. 11(a), the surface region of the active region 43 is thermally oxidized at a temperature of about 1100° C., thereby forming a thermal oxide film. Then, after a polysilicon film has been deposited over the thermal oxide film, the polysilicon and thermal oxide films are patterned, thereby forming the gate insulating film 46 and the polysilicon gate electrode 47 which fill the trench 51. At this time, respective parts of the respective polysilicon and thermal oxide films remain in a middle portion between respective adjacent cells. These remaining parts are taken as a mask 54 for implanting ions. Then, nitrogen ions (N$^+$) are implanted into the p-type SiC layer 42 from above the gate electrode 47 and the mask 54, thereby defining the n$^+$-type source regions 44 containing nitrogen at a concentration of about $1\times10^{18}$ atoms·cm$^{-3}$. In this case, the source regions 44a are formed by implanting ions multiple times at 500° C. with accelerating voltages and at doses of: 30 keV and $5\times10^{13}$ atoms·cm$^{-2}$; 60 keV and $6\times10^{13}$ atoms·cm$^{-2}$; 100 keV and $8\times10^{13}$ atoms·cm$^{-2}$; 110 keV and $5\times10^{13}$ atoms·cm$^{-2}$; 130 keV and $10\times10^{13}$ atoms·cm$^{-2}$; 180 keV and $15\times10^{13}$ atoms·cm$^{-2}$; and 240 keV and $10\times10^{13}$ atoms·cm$^{-2}$, respectively.

Figure 11B:
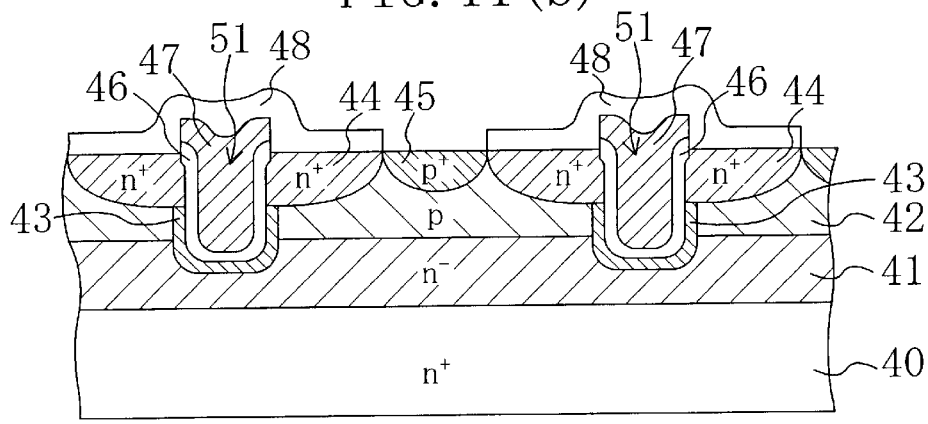
Figure 11C:
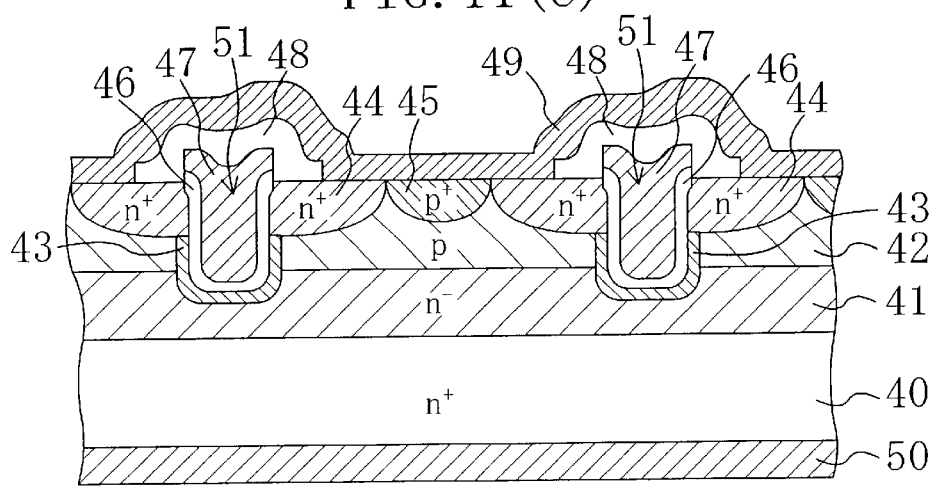

Then, in the process step shown in FIG. 11(b), after removing only the mask 54, the interlevel dielectric film 48 of silicon dioxide is deposited over the substrate and parts of the interlevel dielectric film 48 are removed from respective regions on the substrate that had been covered by the mask. Thereafter, aluminum ions (Al⁺) are implanted in the p-type SiC layer 42 from above the interlevel dielectric film 48, thereby defining the p⁺-type contact regions 45 containing aluminum at a concentration of $1 \times 10^{18}$ atoms·cm⁻³.

Thereafter, in the process step shown in FIG. 11(*c*), only portions of the interlevel dielectric film 48 that have been deposited on parts of the respective n⁺-type source regions 44 are only removed by etching. Then, Ni alloy films are deposited on the surface and the backside surface of the substrate using a vacuum evaporation apparatus, thereby forming source/drain electrodes 49 and 50.

In this embodiment, a vertical power MOSFET in which multiple cells are arranged on a substrate has been described. Alternatively, only one cell may be provided on a substrate. If a plurality of cells are formed on a substrate and then the substrate is cut into chips so that each of the chips includes one or more cells as shown in FIG. 9, each of the semiconductor chips can be used as a vertical power MOSFET.

Other Embodiments

In the foregoing embodiments of the present invention, a gate insulating film is made of a thermal oxide film. However, the present invention is not limited to these embodiments. The present invention is applicable to a structure in which a gate insulating film is made of: a silicon oxynitride film that has been formed by oxidation and nitriding in an ambient containing nitrogen; an oxide film of other materials such as tantalum oxide; or an oxynitride film.

The present invention is applicable not only to a semiconductor device provided on a SiC substrate but also to a general semiconductor device provided on a compound semiconductor substrate containing a plurality of elements such as GaAs, GaN, AlGaAs, SiGe and SiGeC. In such an application, since an active region formed by stacking δ-doped layers and lightly doped layers (including undoped layers), is also formed under a gate insulating film, the channel mobility and the breakdown voltage can be increased by utilizing the reduction in impurity ions, the expansion of a depletion layer throughout the channel region in the OFF state, and the trapping of charges in the impurity contained in the δ-doped layers.

In each of the first through third embodiments, the undoped layers (lightly doped layers) and the δ-doped layers (heavily doped layers) in the active region are made of the same material, i.e., SiC. However, first and second semiconductor layers of the present invention are not necessarily made of the same material. If these layers are made of a common material, the slope of the potential barrier between the two layers inclines more gently. Thus, carriers are easily disposed throughout the active region.

In the first and second embodiments, the substrate does not have to be made of a semiconductor. For example, the substrate may have a structure in which a compound semiconductor layer of single crystals is formed on an insulating substrate, more specifically, a GaN layer is formed on a sapphire substrate.

In the second embodiment, a vertical ACCUFET may be fabricated in the way that a trench is created in a substrate to form a gate electrode and a gate insulating film therein, as in the third embodiment, thereby allowing a current to flow from a surface electrode to a backside electrode. In such a case, the active region made of a stack of δ-doped layers and lightly doped layers (including undoped layers), is also formed along with the gate insulating film. Thus, the same effects as in the second embodiment are exhibited.

In the first through third embodiments, the active region is formed using nitrogen or aluminum for the heavily doped layers. Alternatively, doping gas containing other elements (such as phosphorus (P) or boron (B)) may be used for both of the lightly doped layers (including undoped layers) and the heavily doped layers in the active region.

The present invention is applicable to a multilayer structure composed of lightly doped layers (including undoped layers) and heavily doped layers thinner than the lightly doped layers to a degree (depending on a material, e.g., about 20 nm or less when SiC is used for a substrate) which allows carriers to spread out to the lightly doped layers under a quantum effect, by using not only CVD but also another technique such as sputtering, vapor deposition, or MBE. The thickness of the lightly doped layers (including undoped layers) may be as thick as about 100 nm, or may be sufficiently thin to cause a quantum effect.

In such a case, impurity concentrations in the lightly and heavily doped layers are not limited to the values mentioned in the foregoing embodiments. That is to say, if the difference in impurity concentration between the heavily and lightly doped layers is a predetermined value (e.g., an order of magnitude) or higher, the effects obtained by the present invention are achievable.

EXAMPLES OF EXPERIMENT

Example 1

A description will be given herein below to a first example of experiment relating to basic properties of an active region including δ-doped layers, which was performed to confirm the effects of the present invention. In this first example, broadly speaking, two types of substrates each having an active region were created. One of these substrates is a sample A, which has an active region formed by stacking a plurality of n-type δ-doped layers (heavily doped layers) each having a thickness of 10 nm and containing nitrogen at a concentration of $1 \times 10^{18}$ atoms·cm⁻³ and a plurality of undoped layers (lightly doped layers) each having a thickness of 50 nm. The other is a sample B, which has an active region formed by stacking a plurality of δ-doped layers each having a thickness of 20 nm and a plurality of undoped layers each having a thickness of 100 nm. To determine basic properties of these active regions, Schottky electrodes were provided on these active regions, thereby forming two types of Schottky diodes. Thus the thickness ratio of the δ-doped layers to the undoped layers in both of the samples A and B is 1:5, and therefore the average impurity concentration in the samples A and B is the same. Note that in the following description, an active region (a channel region) made by stacking a plurality of δ-doped layers and a plurality of undoped layers will be also referred to as a δ-doped channel layer.

Figure 14:
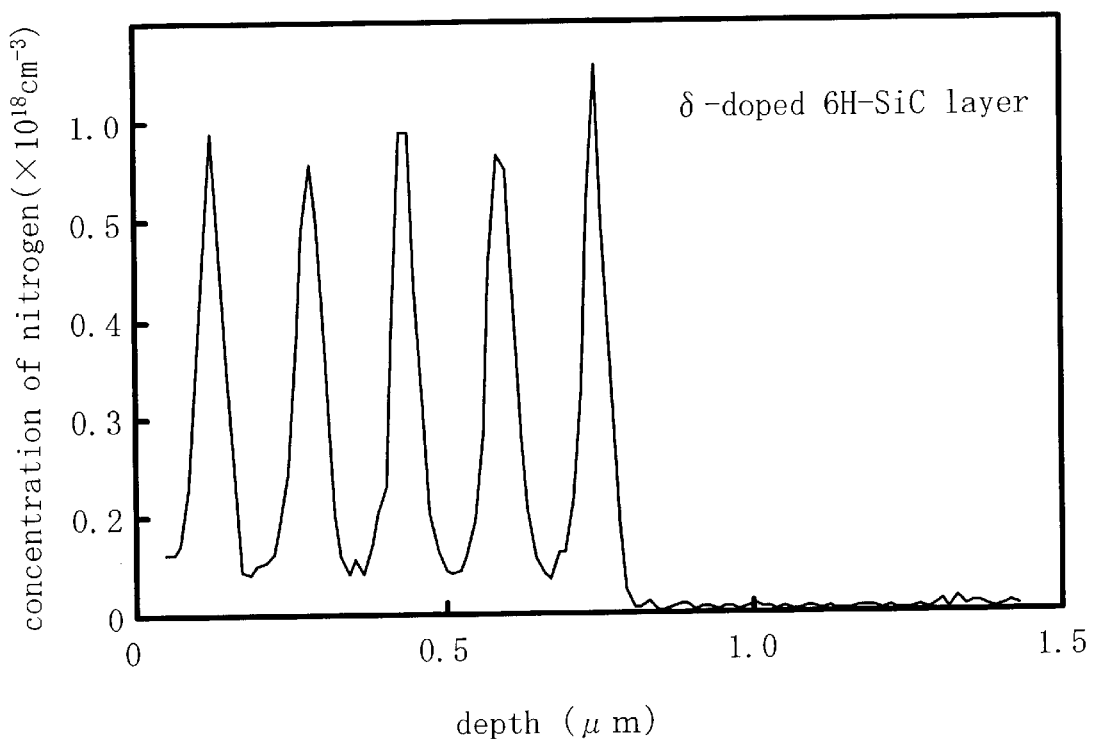
FIG. 14 shows the distribution of dopant concentrations along the depth of an active region according to a first example of experiment.

FIG. 14 shows the distribution of dopant concentrations along the depth of the active region of the sample B created in accordance with this example. As described above, in forming the δ-doped layers, the period during which a pulse valve 20 is open (pulse width) is adjusted to 120 μs and the period during which the pulse valve is closed (interval between pulses) is adjusted to 4 ms. The concentration profile shown in FIG. 14 was obtained as a result of measurement using secondary ion mass spectrometry (SIMS). In the drawing, the axis of abscissas represents a depth (μm) from the uppermost surface of the substrate and the axis of ordinates represents the concentration (atoms·cm⁻³) of nitrogen used as the dopant. As shown in the drawing, the concentration of nitrogen (N) in each of the δ-doped layers formed in accordance with the method of this example is nearly uniform (about $1 \times 10^{18}$ atoms·cm⁻³) and the impurity concentration changes extremely sharply in each of the regions in which the undoped layer shifts to the δ-doped layer and the regions in which the δ-doped layer shifts to the undoped layer. The data shown in FIG. 14 was obtained for the doped layers that have been formed allowing a nitrogen gas to flow as a carrier gas when the period during which the pulse valve is open (pulse width) is set to 120 μs, and therefore the peak concentration of nitrogen shown in FIG. 14 is about $1\times10^{18}$ atoms·cm$^{-3}$. However, if the period during which the pulse valve is open (pulse width) is set to about 110 μs, the peak concentration of nitrogen can be raised to about $1\times10^{19}$ atoms·cm$^{-3}$. Moreover, it is also easy to regulate the nitrogen concentration in the undoped layers to about $1\times10^{16}$ atoms·cm$^{-3}$ if the nitrogen gas, as the carrier gas, is allowed to flow. Letting the carrier gas flow to supply the undoped layers with a certain amount of nitrogen flow is advantageous because this stabilizes the nitrogen concentration in the undoped layers so that it can be controlled to a constant concentration.

Figure 15:
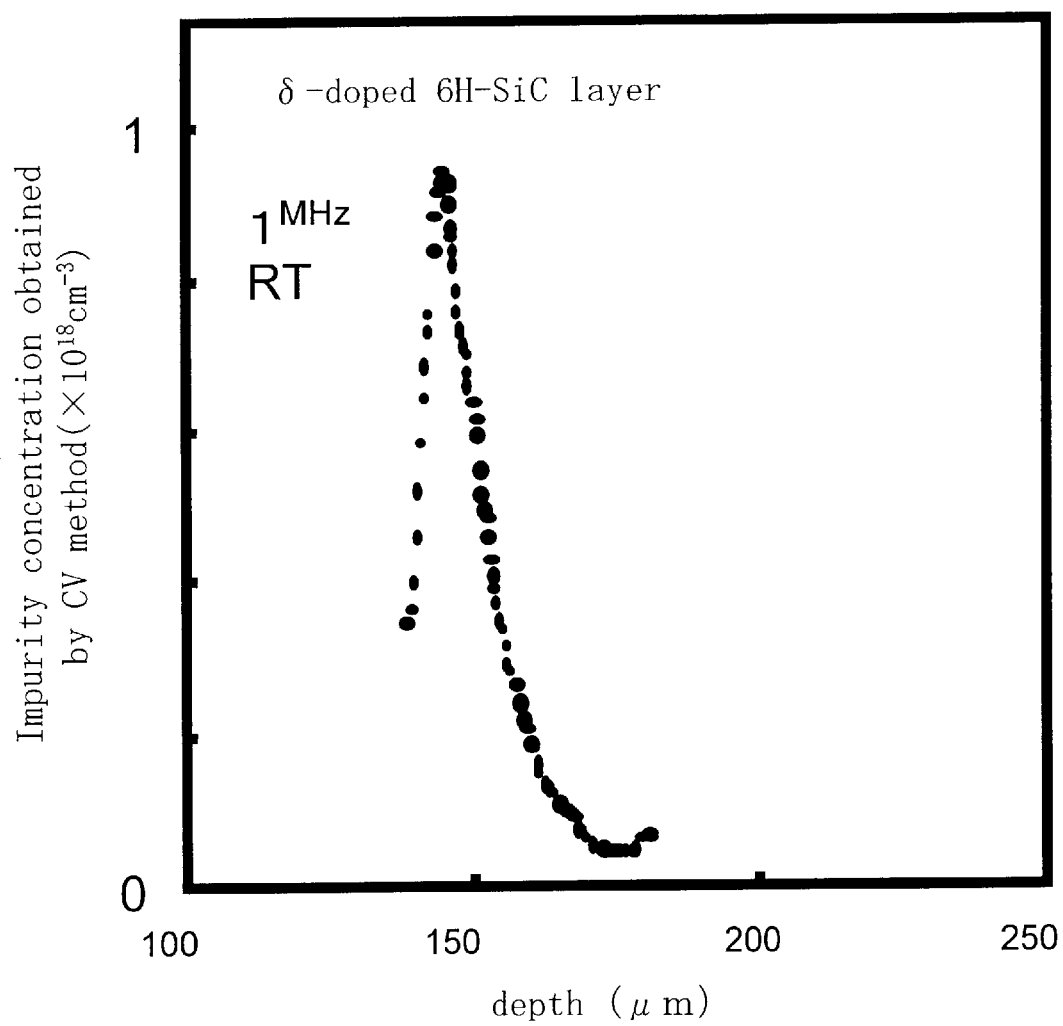
FIG. 15 shows the results of a measurement, using a C-V method, of the impurity concentration in a Schottky diode according to the first example.

FIG. 15 shows the results of a measurement of the impurity concentration in a Schottky diode using a C-V method in order to precisely examine the profile in δ-doped layers in a case where the nitrogen concentration is $1\times10^{18}$ atoms·cm$^{-3}$. The measurement using the C-V method was performed by changing a bias between 0.5 V and −0.2 V and between −0.2 V and −2 V and superimposing an RF signal with a very low amplitude of 1 MHz thereon in a Schottky diode having a circular Ni Schottky electrode with a diameter of 300 μm. The profile of the impurity concentration shown in the drawing is for the δ-doped layers removed from a stack of δ-doped layers each having a thickness of 10 nm and undoped layers each having a thickness of 50 nm. As shown in the drawing, the concentration profile along the depth is substantially vertically symmetrical, and also shows that by the epitaxial growth method according to the embodiments of the present invention, memory effects of doping (effects of residual dopant) during the epitaxial growth with CVD can be ignored. Moreover, the planar carrier concentration in the δ-doped layers obtained by the C-V method is $1.5\times10^{12}$ cm$^{-2}$, which matches comparatively well with the planar carrier concentration of about $2.5\times10^{12}$ cm$^{-2}$ obtained from measurement of Hall coefficient. Also, the full width at half maximum of this pulse-shaped profile is 12 nm, showing considerable sharpness.

Figure 16:
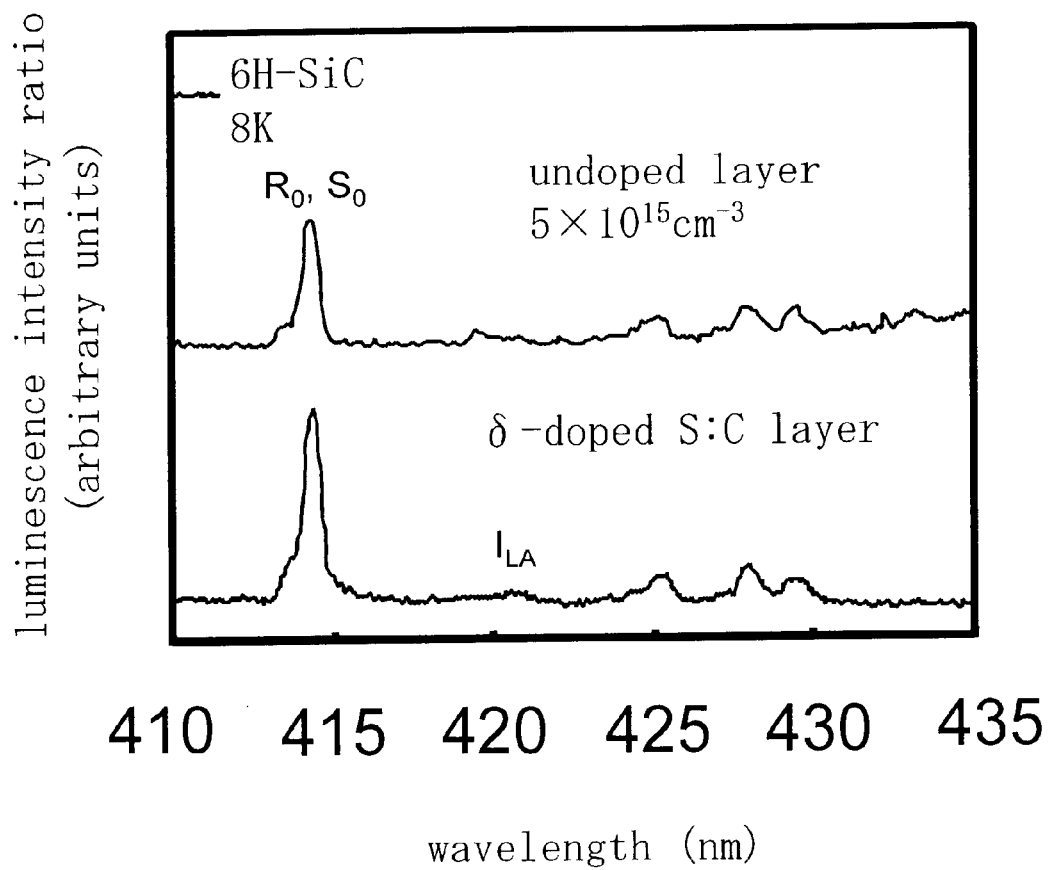
FIG. 16 shows the results of a measurement of the band edge photoluminescence spectra of δ-doped layers in a 6H-SiC substrate according to the first example.

FIG. 16 shows the results of a measurement of the band edge photoluminescence spectra of the δ-doped layers in a 6H-SiC substrate. These spectra were obtained at a temperature of 8 K, and a He—Cd laser with a 0.5 mW intensity was used as an excitation source. This drawing compares the spectrum obtained from an undoped layer included in a stack of δ-doped layers with a thickness of 10 nm and undoped layers with a thickness of 50 nm and the spectrum obtained from an undoped layer with a thickness of 1 μm. As shown in the drawing, both spectrum patterns have luminescence peaks in the same wavelength regions and at the same intensities, and thus it can be seen that both have the same impurity concentration. In other words, the impurity concentration in the undoped layer included in the stack of the δ-doped layers and the undoped layers hardly increases due to the scattering of impurities from the δ-doped layers, and it can be seen that these layers were stacked while maintaining substantially the desired impurity concentration profile. Particular note should be given to the fact that the impurity concentration in the undoped layers was regulated to a low value of about $5\times10^{16}$ atoms·cm$^{-3}$. That is, in the data shown in FIG. 4 it was detected that the impurity concentration in the undoped layers was on the order of $10^{17}$ atoms·cm$^{-3}$. However, this discrepancy was caused by the limits of the measurement sensitivity using SIMS. Then, by using a photoluminescence (PL) method, it was confirmed that the impurity concentration in the undoped layers in the inventive active region, formed by alternately stacking the δ-doped layers and the undoped layers, is as low as about $5\times10^{16}$ atoms·cm$^{-3}$.

Figure 17A:
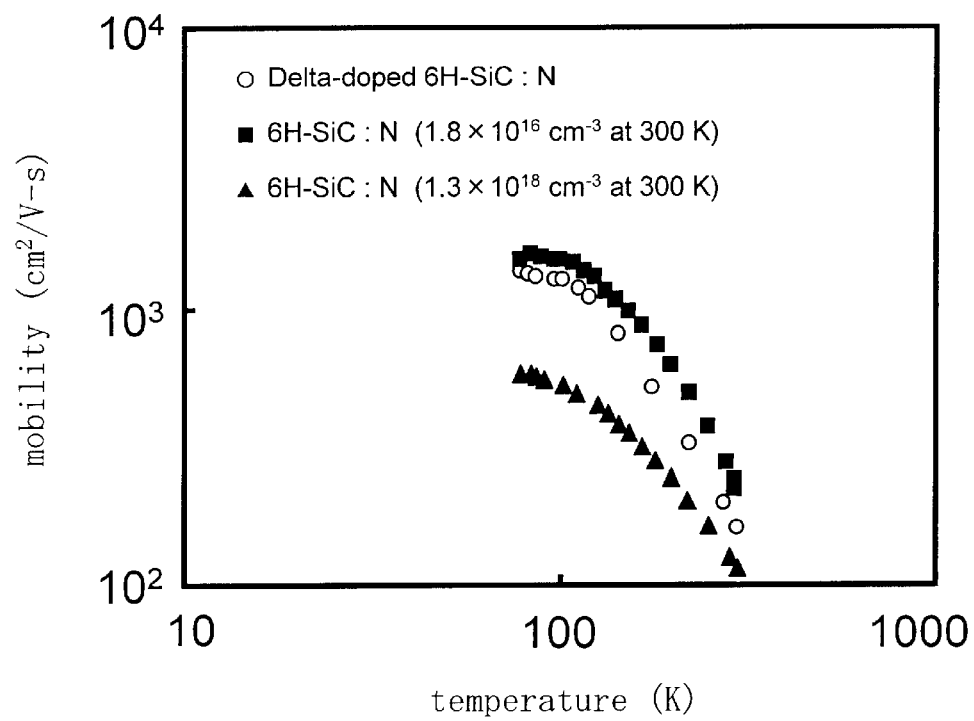
FIGS. 17(a) and 17(b) show the data illustrating the temperature dependencies of electron mobility and of electron concentration, respectively, in a 6H-SiC layer according to the first example.
Figure 17B:
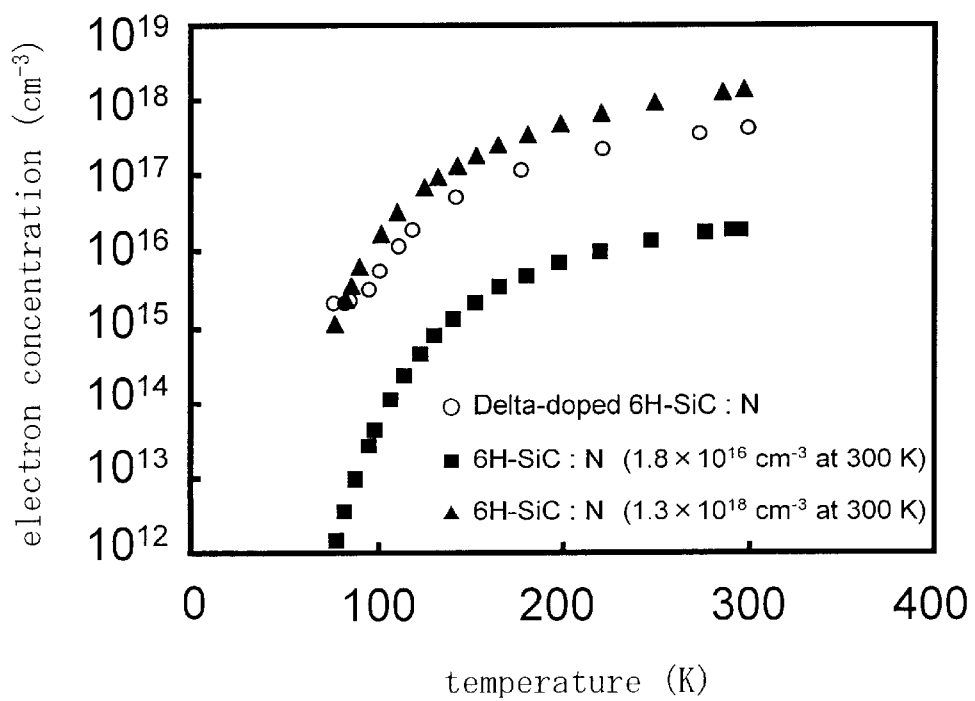

FIGS. 17(a) and 17(b) show the data illustrating the temperature dependencies of electron mobility and of electron concentration, respectively, in an H-SiC layer. In FIGS. 17(a) and 17(b), the data marked with (○) are for the 6H-SiC layer (sample A), which is made by stacking δ-doped layers (where the dopant is nitrogen) each having a thickness of 10 nm and undoped layers each having a thickness of 50 nm, the data marked with (■) are for the uniformly lightly-doped layers (where the concentration is $1.8\times10^{16}$ cm$^{-3}$) of 6H-SiC, and the data marked with (▲) are for the uniformly heavily-doped layers (where the concentration is $1.3\times10^{18}$ cm$^{-3}$) of 6H-SiC. As shown in FIGS. 17(a) and 17(b), the impurity concentration is low in the uniformly lightly-doped layers (where the concentration is $1.8\times10^{16}$ cm$^{-3}$) of 6H-SiC, and therefore the electron mobility therein is high because scattering of carriers caused by impurities decreases when the carriers flow. On the other hand, in the uniformly heavily-doped layers (where the concentration is $1.3\times10^{18}$ cm$^{-3}$) of 6H-SiC, the impurity concentration is high, and therefore the electron mobility therein is low because scattering of carriers caused by impurities increases when the carriers flow. That is to say, there is a trade-off between carrier concentration and a carrier mobility characteristic. In contrast, it can be seen that in the δ-doped layers included in the active region of the sample A, the electron concentration is substantially as high as that of the uniformly heavily-doped layers, and the electron mobility is high. This means that the active region of the present invention has high electron concentration and at the same time can attain a high electron mobility. Thus, it can be seen that this structure is suitable as a region through which electrons flow for diodes and transistors. When the carriers are holes, there is in principle no change from the case where they are electrons, so it can be assumed that in p-type δ-doped layers the hole concentration can be maintained high while a high hole mobility can be achieved.

Figure 18:
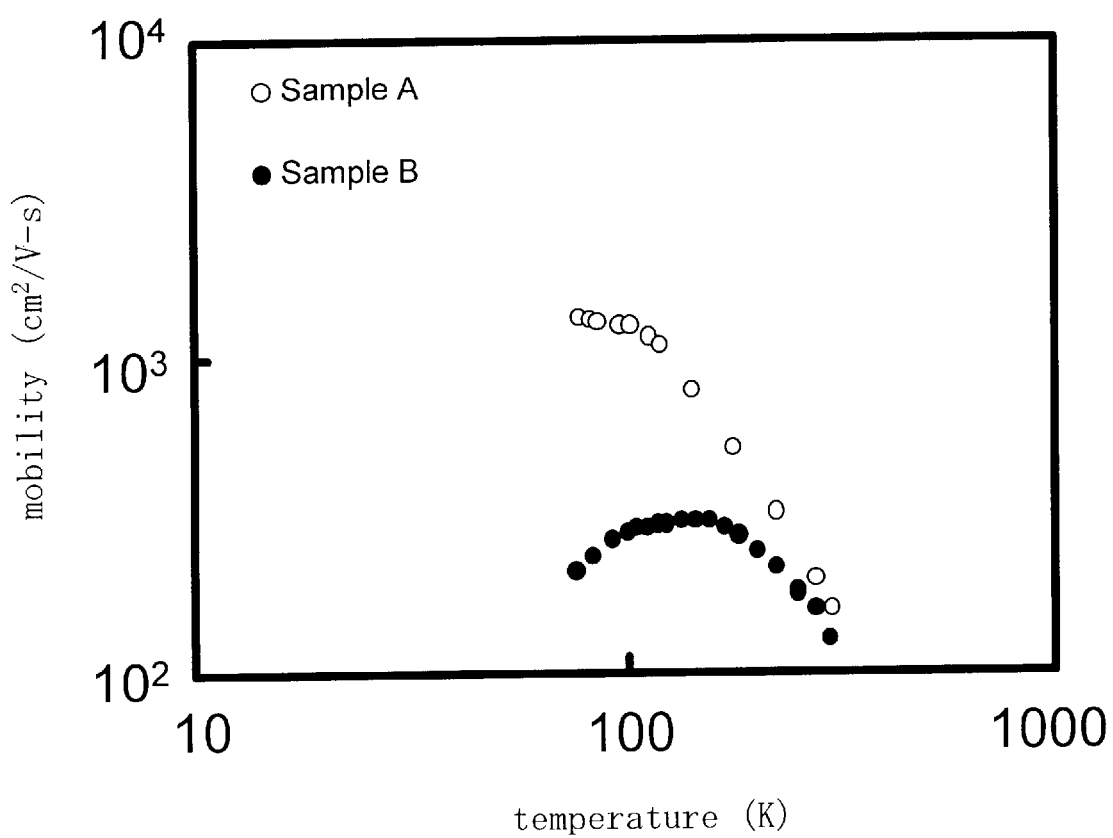
FIG. 18 shows the data illustrating the temperature dependencies of electron mobility in samples A and B in the first example.

FIG. 18 shows the data illustrating the temperature dependency of electron mobility in the sample A, including an active region made by stacking δ-doped layers with a thickness of 10 nm and undoped layers with a thickness of 50 nm, and the sample B, including an active region made by stacking δ-doped layers with a thickness of 20 nm and undoped layers with a thickness of 100 nm. These data on electron mobility were obtained by measuring the samples within a temperature range from 77 K to 300 K. As described above, both of the samples A and B share the same thickness ratio of δ-doped layers to undoped layers of 1:5. Despite the fact that both of the samples A and B were given the same average impurity concentration, it can be seen from the data that the electron mobility in the sample A is higher than that in the sample B. In particular, the drawing shows that in low temperature regions, the electron mobility in the sample B drops as the temperature becomes lower because of scattering caused by ionized impurities, however, in the sample A, a high electron mobility is maintained even as the temperature becomes lower.

Figure 19A:
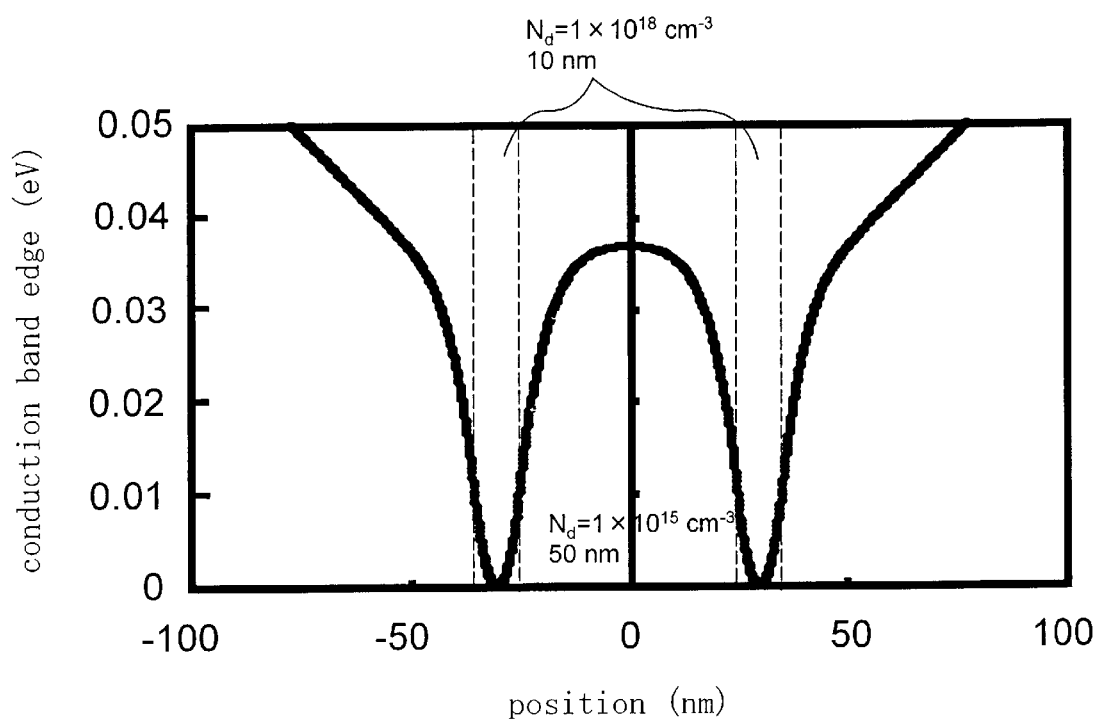
FIG. 19(a) shows the result of simulating a band structure at a conduction band edge and FIG. 19(b) shows the result of simulating the distribution of carrier concentrations, in the sample A in the first example.
Figure 19B:
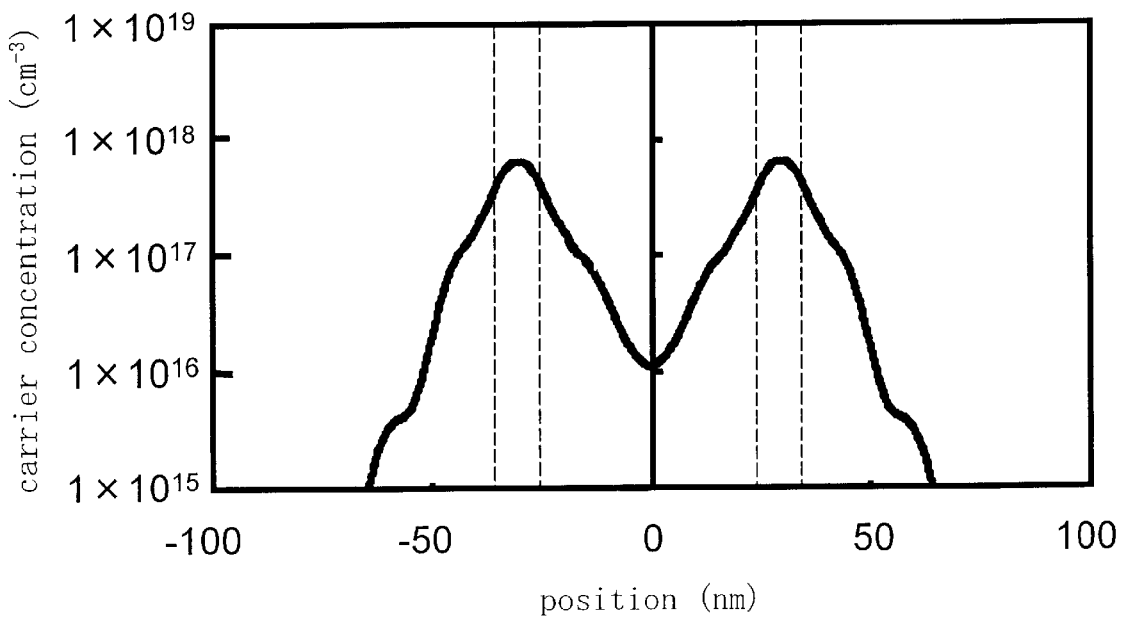
Figure 20A:
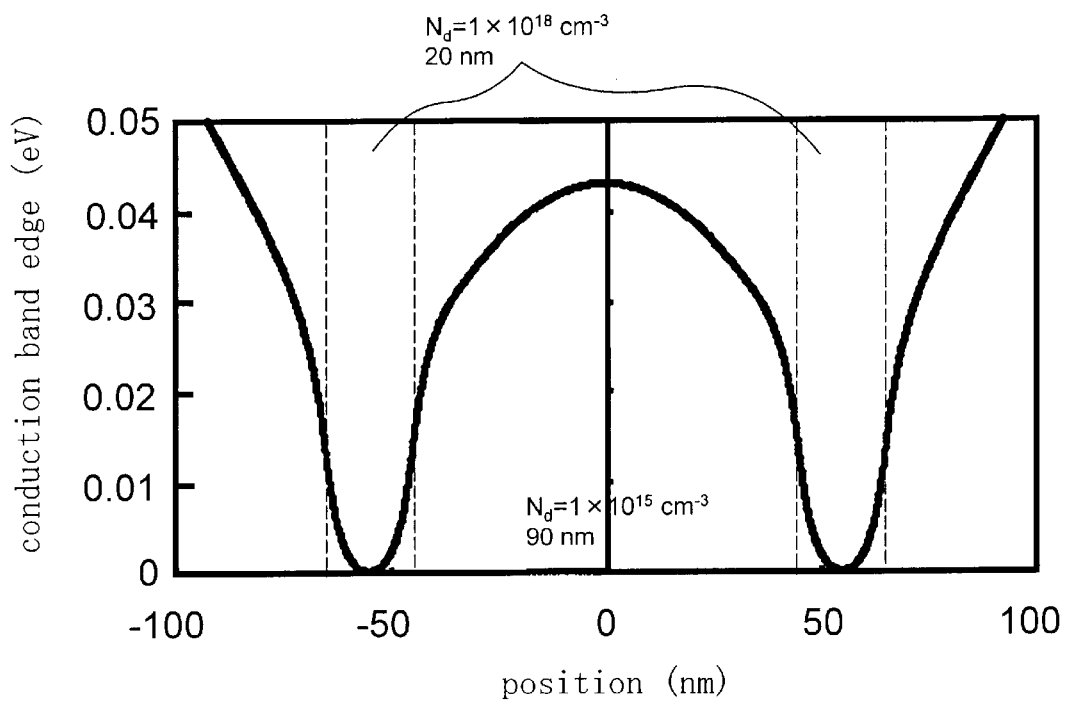
FIG. 20(a) shows the result of simulating a band structure at a conduction band edge and FIG. 20(b) shows the result of simulating the distribution of carrier concentrations, in the sample B in the first example.
Figure 20B:
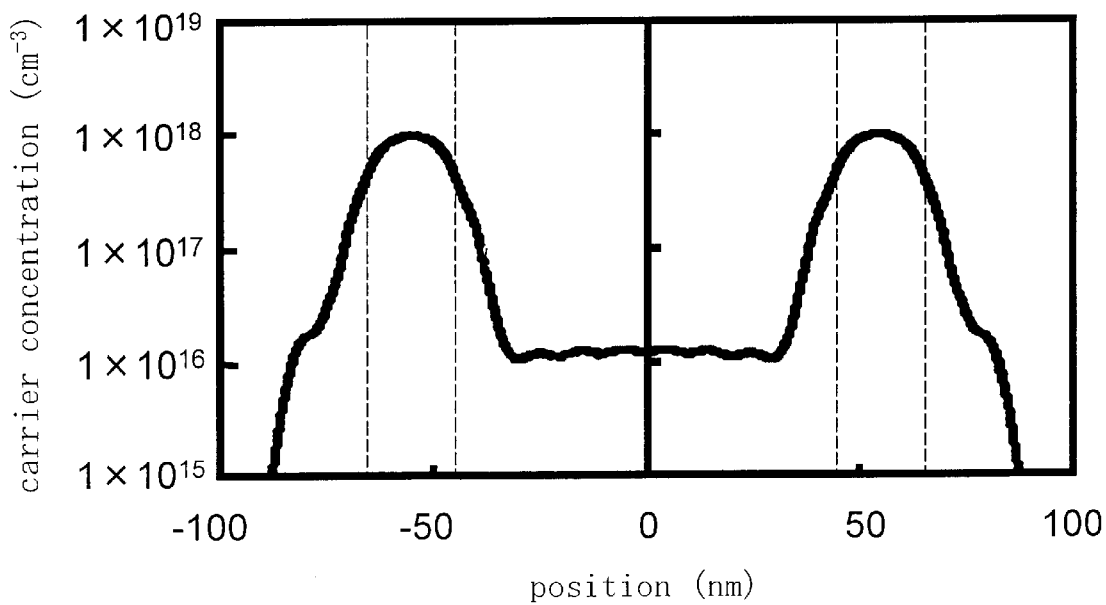

FIG. 19(a) shows the results of a simulation of a band structure at a conduction band edge, and FIG. 19(b) shows the results of a simulation of distribution of carrier concentrations in the sample A having the δ-doped layers with a thickness of 10 nm. FIG. 20(a) shows the results of a simulation of a band structure at a conduction band edge, and FIG. 20(b) shows the results of a simulation of distribution of carrier concentrations in the sample B having the δ-doped layers with a thickness of 20 nm. As shown in FIGS. 19(a) and 20(a), electrons are confined in a V-shaped Coulomb potential (quantum well) sandwiched between donor layers each positively charged in a cross-section orthogonally intersecting the δ-doped layers, and a quantum state is created within the well. The effective mass of an electron is 1.1, and the relative dielectric constant of the 6H-SiC layer is 9.66. A background carrier concentration in the 6H-SiC layer used as the undoped layers is $1 \times 10^{15}$ cm$^{-3}$, and a carrier concentration in the n-type δ-doped layers is $1 \times 10^{18}$ cm$^{-3}$.

As shown in FIG. 19(b), two-dimensional electrons are distributed extensively even in the undoped layer sandwiched between the two δ-doped layers (sample A) with a thickness of 10 nm, and the region in which the concentration of electrons is $2 \times 10^{16}$ cm$^{-3}$ or more is observed in the range at 25 nm from the interface. This indicates that the distribution of carriers shown in FIG. 19(b) is coincident with the state of carrier distribution schematically shown in FIG. 5(a) and that carriers have spread out from the δ-doped layers to the undoped layer.

On the other hand, as shown in FIG. 20(b), a large overlapping portion exists between a region in which the probability of presence of a carrier defined by the wave function of an electron is high and each of the δ-doped layers (sample B) having a large thickness of 20 nm and the center of ionized impurity scattering so that the region in which the electron concentration is $2 \times 10^{16}$ cm$^{-3}$ or more is at 11 nm from the interface. This indicates that a relatively small number of carriers have spread out from the δ-doped layers to the undoped layers.

Example 2

A second example of experiment in which an active region, including δ-doped layers that exhibit a high electron mobility as shown in the first example, is used as a channel region of a MOSFET will be described.

Figure 21:
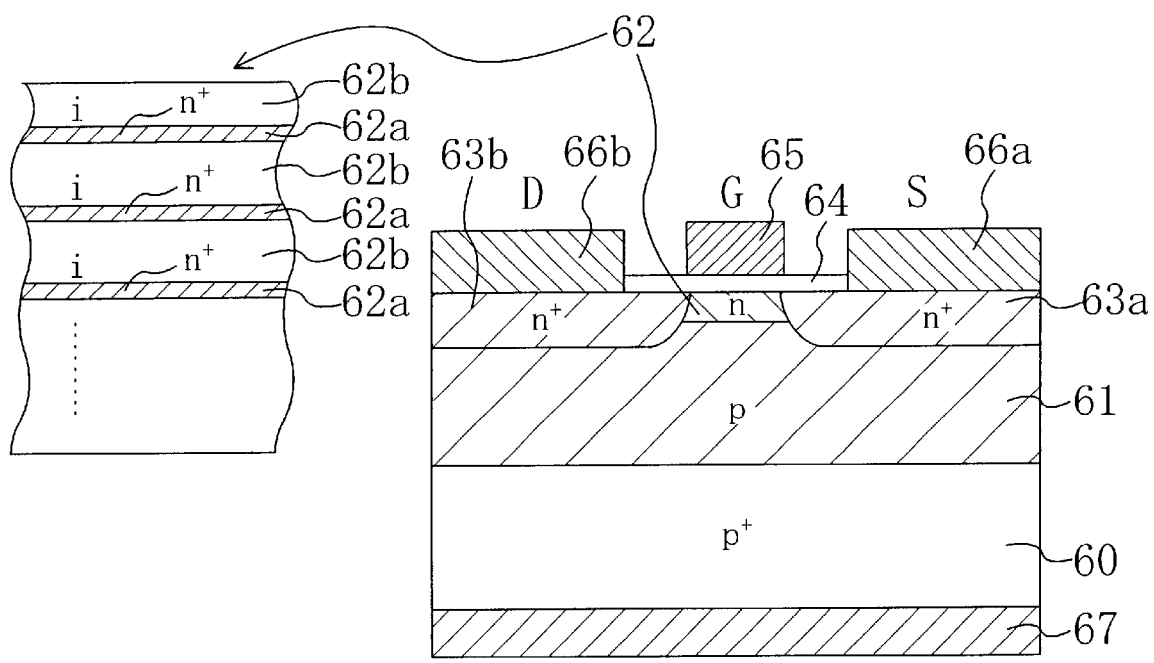
FIG. 21 shows cross-sectional views illustrating the structure of an ACCUFET according to a second example of experiment.

FIG. 21 shows cross-sectional views illustrating the structure of an ACCUFET according to this example. FIG. 21 shows p-type lower active region 61 doped with aluminum at a concentration of about $9 \times 10^{15}$ atoms·cm$^{-3}$ and formed on a p-type SiC substrate 60 doped with aluminum (a p-type impurity) at a concentration of $1 \times 10^{18}$ atoms·cm$^{-3}$; n-type upper active region 62 formed on the lower active region 61 and doped with nitrogen; n-type source/drain regions 63a and 63b formed by implanting nitrogen at a concentration of $1 \times 10^{18}$ cm$^{-3}$ into the upper and lower active regions 62 and 61; gate insulating film 64 of SiO$_2$ formed on the upper active region 62; gate electrode 65 made of an Ni alloy film and formed on the gate insulating film 64; source/drain electrodes 66a and 66b made of an Ni alloy film in ohmic contact with the respective source/drain regions 63a and 63b; and backside electrode 67 made of an Ni alloy film in ohmic contact with the back surface of the SiC substrate 60. The source/drain regions 63a and 63b are formed by implanting ions multiple times at 500° C. with accelerating voltages and at doses of: 30 keV and $5 \times 10^{13}$ atoms·cm$^{-2}$; 60 keV and $6 \times 10^{13}$ atoms·cm$^{-2}$; 100 keV and $8 \times 10^{13}$ atoms·cm$^{-2}$; 110 keV and $5 \times 10^{13}$ atoms·cm$^{-2}$; 130 keV and $10 \times 10^{13}$ atoms·cm$^{-2}$; 180 keV and $15 \times 10^{13}$ atoms·cm$^{-2}$; and 240 keV and $10 \times 10^{13}$ atoms·cm$^{-2}$, respectively.

In this case, the gate length Lg and the gate width Wg of the gate electrode 65 are 5 μm and 180 μm, respectively. The thickness of the gate insulating film 64 is about 40 nm and the thickness of the lower active region 61 of p-type SiC is 5 μm.

As shown in the left part of FIG. 21 under magnification, the upper active region 62 is made by alternately stacking five n-type doped layers 62a each containing nitrogen at a high concentration ($1 \times 10^{18}$ atoms·cm$^{-3}$) and having a thickness of about 10 nm and five undoped layers 62b each made of undoped SiC single crystals and having a thickness of about 50 nm. Thus, the total thickness thereof is about 300 nm. This ACCUFET is normally-OFF and has a threshold voltage of 4.2 V.

That is to say, in this example, the lower active region 61 in the ACCUFET with the structure shown in FIG. 7 is a uniformly doped layer that includes no δ-doped layer.

Figure 22:
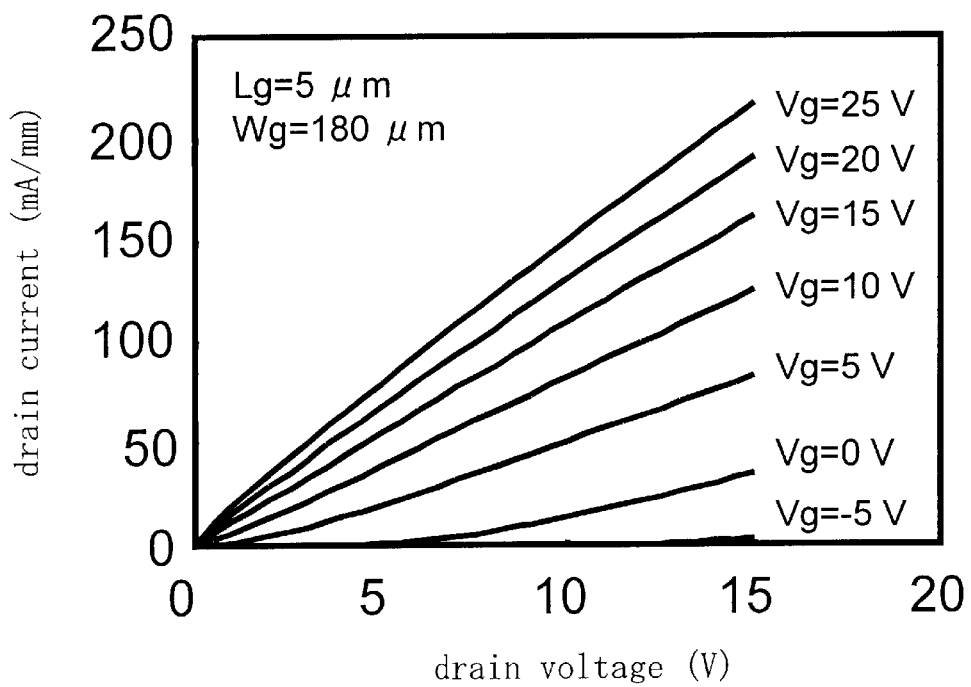
FIG. 22 is a graph showing the I-V characteristics in the ACCUFET formed in accordance with the second example.

FIG. 22 is a graph showing the I-V characteristics (i.e., a change in drain current depending on a change in drain voltage) with respect to an increase in gate bias Vg from −5 V to 25 V by every 5 V in the ACCUFET of this example. This I-V characteristics show that a drain current as large as about 20 mA/mm was obtained even when the gate bias is set to 15 V, which is relatively low for a power electronic device. That is to say, it was confirmed that the ACCUFET of the present invention has high current drive efficiency.

Figure 23:
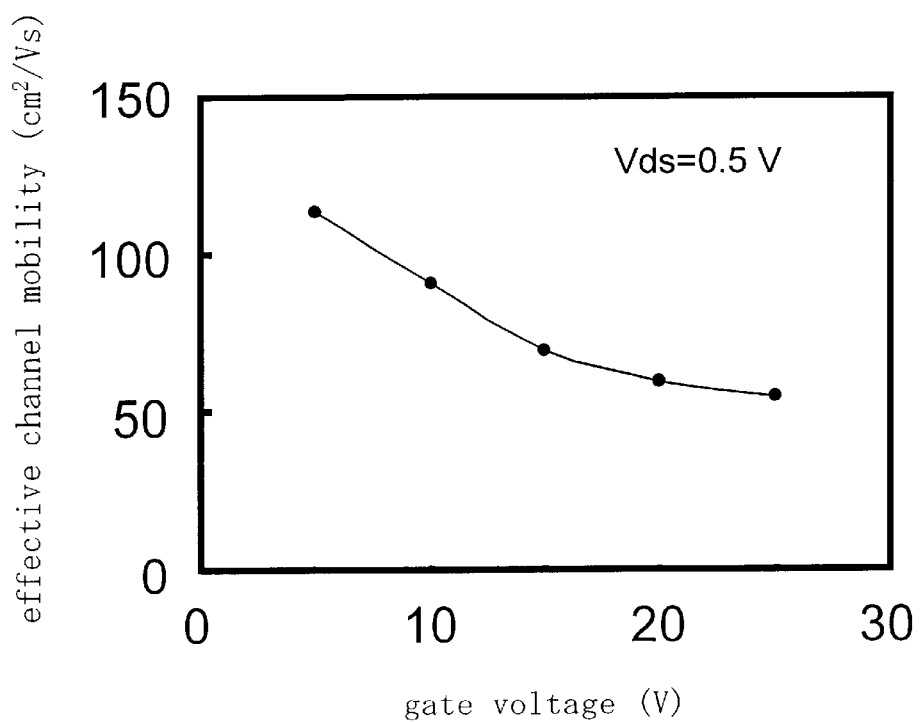
FIG. 23 is a graph showing the dependency of effective channel mobility on gate voltage, which was obtained by calculations based on the data shown in FIG. 22.

FIG. 23 is a graph showing the dependency of effective channel mobility on gate voltage, which was obtained by calculations based on the data shown in FIG. 22. As shown in FIG. 23, it has been confirmed that the ACCUFET of this example exhibits an effective channel mobility of 50 (cm$^2$/Vs) or more even if the gate bias is enhanced. That is to say, while a FET exhibits current drive efficiency which is proportional to its effective channel mobility, the ACCUFET of this example exhibits a high effective channel mobility and thus high current drive efficiency because this ACCUFET has the structure made by alternately stacking the δ-doped layers and the undoped layers as described above.

Combining the above examples and other simulation data, it was found that the preferable thickness of the heavily doped layers, when a SiC layer is used, is at least one monolayer and less than 20 nm. Additionally, it is preferable that the thickness of the lightly doped layers (including undoped layers) is at least about 10 nm but not more than about 100 nm. The thicknesses of these heavily and lightly doped layers can be suitably selected according to the type and purpose of the active element (diode or transistor, for example) for which they are used.

In a case in which the semiconductor layer is other than a SiC layer, for example, a GaAs layer, AlGaAs layer, GaN layer, AlGaN layer, SiGe layer, or SiGeC layer, the appropriate thickness of the heavily doped layers (δ-doped layers) is determined according to that material. For example, if a GaAs layer is used, δ-doped layers of one monolayer can be provided. It can be said that generally, so long as carrier supply capabilities are appropriately maintained, to increase the breakdown voltage at the same thickness, it is preferable that the thickness of the heavily doped layers (δ-doped layers) is as thin as possible.

INDUSTRIAL APPLICABILITY

A semiconductor device according to the present invention is applicable to a device, such as MOSFET, ACCUFET, vertical MOSFET, or DMSO device, which is mounted in an electronic unit, and in particular, to a device handling an RF signal and a power electronic device.

What is claimed is:

1. A semiconductor device comprising:
   a compound semiconductor layer formed on a substrate;
   two heavily doped regions, which are defined and spaced apart from each other in the compound semiconductor layer and contain an impurity of a first conductivity type;
   an active region, which is sandwiched between the two heavily doped regions and contains an impurity of a second conductivity type;
   a gate insulating film formed on the active region; and
   a gate electrode formed on the gate insulating film, wherein the active region comprises a plurality of heavily doped layers containing the impurity of the second conductivity type, and a plurality of semiconductor layers each composed of a lightly doped layer containing the impurity of the second conductivity type at a concentration lower than in the heavily doped layer, or composed of an undoped layer containing no impurity, and
   a plurality of heavily doped layers and a plurality of semiconductor layers are alternately stacked.

2. The semiconductor device of claim 1, wherein a plurality of heavily doped layers each has the same thickness.

3. The semiconductor device of claim 2, wherein the thickness of a plurality of heavily doped layers is not less than one monolayer to not more than 20 nm.

4. The semiconductor device of claim 1, wherein a plurality of semiconductor layers each has the same thickness.

5. The semiconductor device of claim 4, wherein the thickness of a plurality of semiconductor layers is not less than 10 nm to not more than 100 nm.

6. The semiconductor device of claim 1, wherein the impurity of the first conductivity type is an n-type impurity and the impurity of the second conductivity type is a p-type impurity.

7. The semiconductor device of claim 1, wherein the substrate and the compound semiconductor layer are formed as a unit, and
   wherein a trench is formed by digging in the compound semiconductor, and
   wherein the gate insulating film and the gate electrode are formed so as to surround the bottom and the side faces of the trench, and
   the one of the two heavily doped layers is defined in the surface part of the compound semiconductor layer and the other is defined in the lowest part of the compound semiconductor layer.

8. A semiconductor device comprising:
   a compound semiconductor layer formed on a substrate;
   two heavily doped regions, which are defined and spaced apart from each other in the compound semiconductor layer and contain an impurity of a first conductivity type;
   a first active region, which is sandwiched between the two heavily doped regions and contains the impurity of the first conductivity type at a concentration lower than in the impurity of the first conductivity type in the two heavily doped regions;
   a gate insulating film formed on the active region; and
   a gate electrode formed on the gate insulating film,
   wherein the first active region comprises a plurality of heavily doped layers containing the impurity of the first conductivity type, and a plurality of semiconductor layers each composed of a lightly doped layer containing the impurity of the first conductivity type at a concentration lower than in the heavily doped layer, or composed of an undoped layer containing no impurity, and
   a plurality of heavily doped layers and a plurality of semiconductor layers are alternately stacked.

9. The semiconductor device of claim 8, wherein a plurality of heavily doped layers each has the same thickness.

10. The semiconductor device of claim 9, wherein the thickness of a plurality of heavily doped layers is not less than one monolayer to not more than 20 nm.

11. The semiconductor device of claim 8, wherein a plurality of semiconductor layers each has the same thickness.

12. The semiconductor device of claim 11, wherein the thickness of a plurality of semiconductor layers is not less than 10 nm to not more than 100 nm.

13. The semiconductor device of claim 8, wherein the impurity of the first conductivity type is an n-type impurity.

14. The semiconductor device of claim 8, further comprising a second active region, which is sandwiched between the first active region and the gate insulating film and contains the impurity of the second conductivity type,
    wherein the second active region comprises a plurality of heavily doped layers containing the impurity of the second conductivity type, and a plurality of semiconductor layers each composed of a lightly doped layer containing the impurity of the second conductivity type at a concentration lower than in the heavily doped layer, or composed of an undoped layer containing no impurity, and
    a plurality of heavily doped layers and a plurality of semiconductor layers are alternately stacked.

15. The semiconductor device of claim 14, wherein a plurality of heavily doped layers each has the same thickness.

16. The semiconductor device of claim 15, wherein the thickness of a plurality of heavily doped layers is not less than one monolayer to not more than 20 nm.

17. The semiconductor device of claim 14, wherein a plurality of semiconductor layers each has the same thickness.

18. The semiconductor device of claim 17, wherein the thickness of a plurality of semiconductor layers is not less than 10 nm to not more than 100 nm.

19. The semiconductor device of claim 14, wherein the impurity of the first conductivity type is an n-type impurity and the impurity of the second conductivity type is a p-type impurity.

20. The semiconductor device of claim 14, further comprising a third active region, which is sandwiched between the first active region and the gate insulating film and contains the impurity of the second conductivity type,
    wherein the third active region comprises a plurality of heavily doped layers containing the impurity of the second conductivity type, and a plurality of semiconductor layers each composed of a lightly doped layer containing the impurity of the second conductivity type at a concentration lower than in the heavily doped layer, or composed of an undoped layer containing no impurity, and
    a plurality of heavily doped layers and a plurality of semiconductor layers are alternately stacked.

21. The semiconductor device of claim 20, wherein a plurality of heavily doped layers each has the same thickness.

22. The semiconductor device of claim 21, wherein the thickness of a plurality of heavily doped layers is not less than one monolayer to more than 20 nm.

23. The semiconductor device of claim 20, wherein a plurality of semiconductor layers each has the same thickness.

24. The semiconductor device of claim 23, wherein the thickness of a plurality of semiconductor layers is not less than 10 nm to not more than 100 nm.

25. The semiconductor device of claim 20, wherein the impurity of the first conductivity type is an n-type impurity and the impurity of the second conductivity type is a p-type impurity.

26. The semiconductor device of claim 20, wherein the substrate and the compound semiconductor layer are formed as a unit, and wherein a trench is formed by digging in the compound semiconductor layer, and wherein the gate insulating film and the gate electrode are formed so as to surround the bottom and the side faces of the trench, and the one of the two heavily doped layers is defined in the surface part of the compound semiconductor layer and the other is defined in the lowest part of the compound semiconductor layer.

27. The semiconductor device of claim 14, wherein the substrate and the compound semiconductor layer are formed as a unit, and wherein a trench is formed by digging in the compound semiconductor layer, and wherein the gate insulating film and the gate electrode are formed so as to surround the bottom and the side faces of the trench, and the one of the two heavily doped layers is defined in the surface part of the compound semiconductor layer and the other is defined in the lowest part of the compound semiconductor layer.

28. The semiconductor device of claim 8, wherein the substrate and the compound semiconductor layer are formed as a unit, and wherein a trench is formed by digging in the compound semiconductor layer, and wherein the gate insulating film and the gate electrode are formed so as to surround the bottom and the side faces of the trench, and the one of the two heavily doped layers is defined in the surface part of the compound semiconductor layer and the other is defined in the lowest part of the compound semiconductor layer.

* * * * *

UNITED STATES PATENT AND TRADEMARK OFFICE
CERTIFICATE OF CORRECTION

PATENT NO.    : 6,617,653 B1
DATED         : September 9, 2003
INVENTOR(S)   : Toshiya Yokogawa et al.

It is certified that error appears in the above-identified patent and that said Letters Patent is hereby corrected as shown below:

Title page,
Item [30], Foreign Application Priority Data, "May 31, 2000 (JP) 2000-101598" should be -- May 31, 2000 (JP) 2000-161598 --
Item [56], References Cited, OTHER PUBLICATIONS, "Kenji Noda, et al.," reference, "Selectivity" should be -- Selective" --; and "K. Nakagawa, et al.," reference, insert before "Using" -- Fabricated --

Signed and Sealed this

Nineteenth Day of October, 2004

JON W. DUDAS
*Director of the United States Patent and Trademark Office*